(12) United States Patent
Kim et al.

(10) Patent No.: US 10,587,832 B2
(45) Date of Patent: Mar. 10, 2020

(54) ANALOG TO DIGITAL CONVERTING CIRCUIT AND AN OPERATION METHOD THEREOF

(71) Applicant: SAMSUNG ELECTRONICS CO., LTD., Suwon-si, Gyeonggi-Do (KR)

(72) Inventors: Yunhong Kim, Hwaseong-si (KR); Kyung-Min Kim, Seoul (KR); Heesung Chae, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/996,996

(22) Filed: Jun. 4, 2018

(65) Prior Publication Data

US 2019/0132538 A1  May 2, 2019

(30) Foreign Application Priority Data

Oct. 31, 2017  (KR) .......................... 10-2017-0143154

(51) Int. Cl.
    *H04N 5/378* (2011.01)
    *H03M 1/00* (2006.01)
    *H03M 1/56* (2006.01)

(52) U.S. Cl.
    CPC ............ *H04N 5/378* (2013.01); *H03M 1/007* (2013.01); *H03M 1/56* (2013.01)

(58) Field of Classification Search
    CPC ......... H04N 5/378; H03M 1/007; H03M 1/56

USPC .......................................................... 341/155
See application file for complete search history.

(56) References Cited

U.S. PATENT DOCUMENTS

| 7,705,897 | B2 | 4/2010 | Muramatsu |
| 7,973,695 | B2* | 7/2011 | Kudo ....................... H03K 4/02 |
| | | | 341/155 |
| 8,546,738 | B2 | 10/2013 | Fukushima |
| 8,749,420 | B2 | 6/2014 | Takahashi et al. |
| 9,204,070 | B2 | 12/2015 | Takahashi et al. |
| 9,360,233 | B2 | 6/2016 | Yang et al. |

FOREIGN PATENT DOCUMENTS

| JP | 2010183405 | 8/2010 |
| JP | 2014135645 | 7/2014 |
| KR | 10-2015-0107045 | 9/2014 |
| KR | 10-1736393 | 5/2017 |

* cited by examiner

*Primary Examiner* — Khai M Nguyen
(74) *Attorney, Agent, or Firm* — F. Chau & Associates, LLC

(57) ABSTRACT

An analog to digital converting circuit includes a correlated double sampling circuit (CDS) that compares a pixel signal with a ramp signal, and outputs a comparison signal, a timing amplifier that increases an active time of the comparison signal "N" times, and outputs an extended signal, wherein the "N" is a positive integer, and a counter that outputs a digital signal corresponding to the pixel signal in response to the extended signal and a first clock signal.

20 Claims, 21 Drawing Sheets

ANALOG TO DIGITAL CONVERTING CIRCUIT AND AN OPERATION METHOD THEREOF

CROSS-REFERENCE TO RELATED APPLICATION

This application claims priority under 35 U.S.C. § 119 to Korean Patent Application No. 10-2017-0143154 filed Oct. 31, 2017, in the Korean Intellectual Property Office, the disclosure of which is incorporated by reference herein in its entirety.

TECHNICAL FIELD

Exemplary embodiments of the inventive concept described herein relate to an analog to digital converter (ADC), and more particularly, to an analog to digital converting circuit and an operation method thereof.

DISCUSSION OF RELATED ART

An analog to digital converter (ADC) receives an analog input voltage and converts the received analog input voltage to a digital signal. For example, the ADC may convert an analog signal, such as a sound picked up by a microphone or light entering a digital camera, into a digital signal. The converted digital signal may be sent to other devices. The ADC may be used in various signal processing devices.

To increase the performance of signal processing devices, an ADC may have an increased resolution with regard to an analog signal. To accomplish this, the above-described signal conversion operation is performed by using a high-speed clock signal. However, the high-speed clock signal may cause an increase in power consumption.

SUMMARY

According to an exemplary embodiment of the inventive concept, an analog to digital converting circuit includes a correlated double sampling circuit (CDS) that compares a pixel signal with a ramp signal, and outputs a comparison signal, a timing amplifier that increases an active time of the comparison signal "N" times, and outputs an extended signal, wherein the "N" is a positive integer, and a counter that outputs a digital signal corresponding to the pixel signal in response to the extended signal and a first clock signal.

According to an exemplary embodiment of the inventive concept, an analog to digital converting circuit includes a CDS circuit that compares a pixel signal with a ramp signal, and outputs a comparison signal, a counter that generates an internal comparison signal in response to the comparison signal and a first clock signal, and a timing amplifier that increases an active time of the internal comparison signal "N" times, and outputs an internal extended signal, wherein the "N" is a positive integer. The counter is further configured to perform a first counting operation in response to the comparison signal and the first clock signal, to perform a second counting operation in response to the internal extended signal and a second clock signal, and to output a digital signal in response to a result of the first counting operation and a result of the second counting operation.

According to an exemplary embodiment of the inventive concept, an operation method of an analog to digital converting circuit includes comparing an analog signal with a ramp signal to generate a comparison signal, increasing an active time of the comparison signal "N" times to generate an extended signal, wherein the "N" is a positive integer, and performing a counting operation in response to the extended signal and a clock signal to generate a digital signal corresponding to the analog signal.

According to an exemplary embodiment of the inventive concept, an image device includes: a pixel array; a row decoder connected to the pixel array through reset lines and word lines; an analog to digital converter (ADC) connected to the pixel array through bit lines; and a sensor controller configured to control the row decoder and the ADC such that an external image is captured through the pixel array, wherein the ADC is configured to generate a comparison signal in response to a pixel signal and a ramp signal, wherein the comparison signal has a first level for a first time period in which the ramp signal is greater than the pixel signal, the ADC is further configured to generate an extended signal which has the first level for a second time period that is greater than the first time period, and to generate a data signal corresponding to the pixel signal in response to the extended signal and a clock signal.

BRIEF DESCRIPTION OF THE FIGURES

The above and other features of the inventive concept will become apparent by describing in detail exemplary embodiments thereof with reference to the accompanying drawings.

DETAILED DESCRIPTION OF THE EMBODIMENTS

Figure 1:
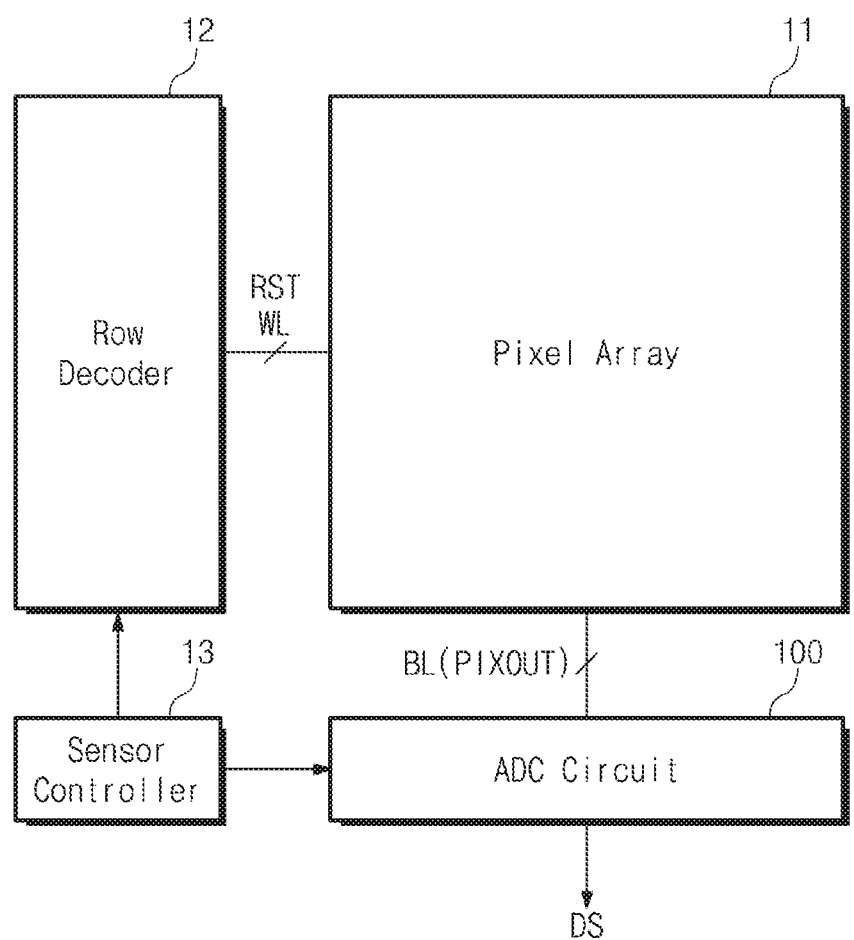
FIG. 1 is a block diagram illustrating an image device to which an analog to digital converting (ADC) circuit according to an exemplary embodiment of the inventive concept is applied.

Below, exemplary embodiments of the inventive concept will be described in conjunction with the accompanying drawings in which like reference numerals may refer to like elements.

Components described herein with reference to terms "part", "unit", "module", etc. and function blocks (or intellectual property (IP) blocks) illustrated in drawings may be implemented with software, hardware, or a combination thereof, for example. In an exemplary embodiment of the inventive concept, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

FIG. 1 is a block diagram illustrating an image device 10 to which an analog to digital converting (ADC) circuit 100 according to an exemplary embodiment of the inventive concept is applied. Hereinafter, exemplary embodiments of the inventive concept will be described with reference to the ADC circuit 100 included in the image device 10. However, the inventive concept may not be limited thereto. For example, the ADC circuit 100 according to an exemplary embodiment of the inventive concept may be applied to various sensors, various signal processing devices, and the like to perform an operation of converting an analog signal to a digital signal.

Referring to FIG. 1, the image device 10 may include a pixel array 11, a row decoder 12, a sensor controller 13, and the ADC circuit 100. The pixel array 11 may include a plurality of pixels. The plurality of pixels may be arranged in a row direction and a column direction. Pixels belonging to the same column may be connected with the same bit line BL. Pixels belonging to the same row may be connected with the same reset line RST or the same word line WL. Each pixel of the pixel array 11 may output a pixel signal PIXOUT depending on the intensity or the amount of light received from the outside, for example, from outside the image device 10. In this case, the pixel signal PIXOUT may be an analog signal that corresponds to the intensity or the amount of light received from the outside.

The row decoder 12 may be connected with the pixel array 11 through the reset lines RST and the word lines WL. The row decoder 12 may control the reset lines RST and the word lines WL under control of the sensor controller 13. The sensor controller 13 may control the row decoder 12 and the ADC circuit 100 such that an external image is captured through the pixel array 11. In an exemplary embodiment of the inventive concept, lines connecting the row decoder 12 and the pixel array 11 may be variously modified according to a structure of the plurality of pixels included in the pixel array 11.

The ADC circuit 100 is connected with the pixel array 11 through the bit lines BL. The ADC circuit 100 may receive the pixel signal PIXOUT from each of the plurality of pixels of the pixel array 11 through the bit lines BL. The ADC circuit 100 may convert the received pixel signal PIXOUT to a digital signal DS. The ADC circuit 100 may send the converted digital signal DS to an external device (e.g., an image processor or the like).

In an exemplary embodiment of the inventive concept, the ADC circuit 100 may increase a length of a comparison signal corresponding to the pixel signal PIXOUT as much as "N" times (N being a positive integer) to convert the pixel signal PIXOUT to the digital signal DS. The comparison signal may be a signal that depends on the pixel signal PIXOUT and a specific signal (e.g., a ramp signal). As the length of the comparison signal increases "N" times, the ADC circuit 100 may perform the above-described conversion operation by using a relatively slow clock signal (e.g., a clock signal having a relatively low frequency or a clock signal having a relatively slow speed). In an exemplary embodiment of the inventive concept, as the frequency or speed of the clock signal decreases, power consumption of the ADC circuit 100 may decrease. A structure and an operation of the ADC circuit 100 will be more fully described with reference to the following drawings.

Figure 2:
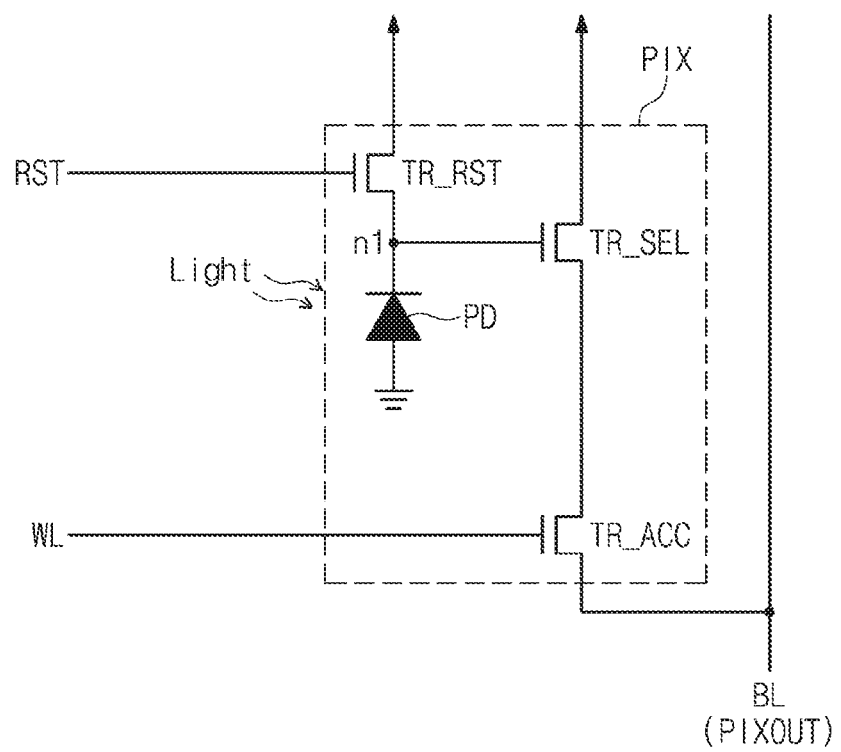
FIG. 2 is a view illustrating a pixel included in a pixel array of FIG. 1, according to an exemplary embodiment of the inventive concept.

FIG. 2 is a view illustrating a pixel PIX included in the pixel array 11 of FIG. 1, according to an exemplary embodiment of the inventive concept. In an exemplary embodiment of the inventive concept, one pixel PIX of a plurality of pixels included in the pixel array 11 will be described with reference to FIG. 2. However, the inventive concept is not limited to the structure and functionality of the one pixel PIX to be described hereinafter.

Referring to FIG. 2, the pixel PIX may include a photodiode PD, a reset transistor TR_RST, a selection transistor TR_SEL, and an access transistor TR_ACC. In an exemplary embodiment of the inventive concept, the pixel PIX illustrated in FIG. 2 may be an image pixel of a 3-transistor (TR) structure. However, the inventive concept is not limited thereto. For example, the pixel PIX may have various structures such as a 1-TR structure, a 4-TR structure, a 2-PD structure, and the like.

A first end of the reset transistor TR_RST is connected with a power supply voltage, and a second end of the reset transistor TR_RST is connected with a first node n1. The first reset transistor TR_RST may reset a voltage of the first node n1 to the power supply voltage in response to a reset signal RST.

The photodiode PD may charge charges at the first node n1 depending on light incident from the outside. A first end of the selection transistor TR_SEL is connected with the power supply voltage, and a second end of the selection transistor TR_SEL is connected with a first end of the access transistor TR_ACC. The selection transistor TR_SEL may be driven according to a voltage of the first node n1. A second end of the access transistor TR_ACC is connected with the bit line BL. The access transistor TR_ACC may operate depending on a control signal of the word line WL to output the pixel signal PIXOUT through the bit line BL. In an exemplary embodiment of the inventive concept, as described above, the pixel signal PIXOUT may be an analog signal that corresponds to the intensity or the amount of light incident to the photodiode PD.

Figure 3:
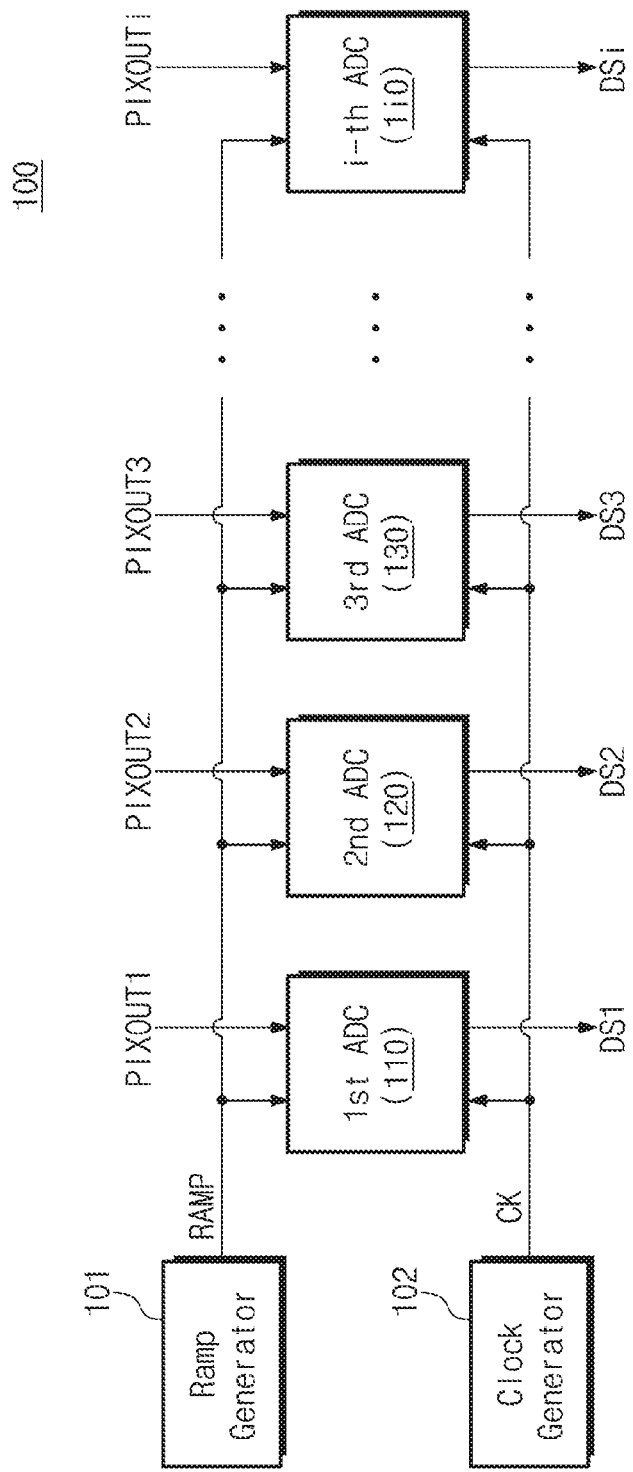
FIG. 3 is a block diagram illustrating the ADC circuit of FIG. 1, according to an exemplary embodiment of the inventive concept.

FIG. 3 is a block diagram illustrating the ADC circuit 100 of FIG. 1, according to an exemplary embodiment of the inventive concept. Referring to FIGS. 1 and 3, the ADC circuit 100 may include a ramp generator 101, a clock generator 102, and a plurality of analog to digital converters (ADCs) 110 to 1i0.

The ramp generator 101 may generate a ramp signal RAMP. The ramp signal RAMP may be a signal that increases or decreases linearly (or non-linearly) during a specific time. In other words, the ramp signal RAMP may be a signal that increases or decreases depending on a preset slope. The ramp generator 101 may generate the ramp signal RAMP depending on a preset value (e.g., a start level, an end level, a slope, or the like).

The clock generator 102 may generate a clock signal CK. The clock signal CK may be a signal that has a given period or a given frequency. In an exemplary embodiment of the inventive concept, the clock generator 102 may vary a frequency of the clock signal CK.

The plurality of ADCs 110 to 1i0 may be connected with the pixel array 11 through the plurality of bit lines BL, may respectively receive a plurality of pixel signals PIXOUT1 to PIXOUTi through the plurality of bit lines BL, may receive the clock signal CK from the clock generator 102, and may receive the ramp signal RAMP from the ramp generator 101. The plurality of ADCs 110 to 1i0 may convert the plurality of pixel signals PIXOUT1 to PIXOUTi to a plurality of digital signals DS1 to DSi, respectively.

Figure 4:
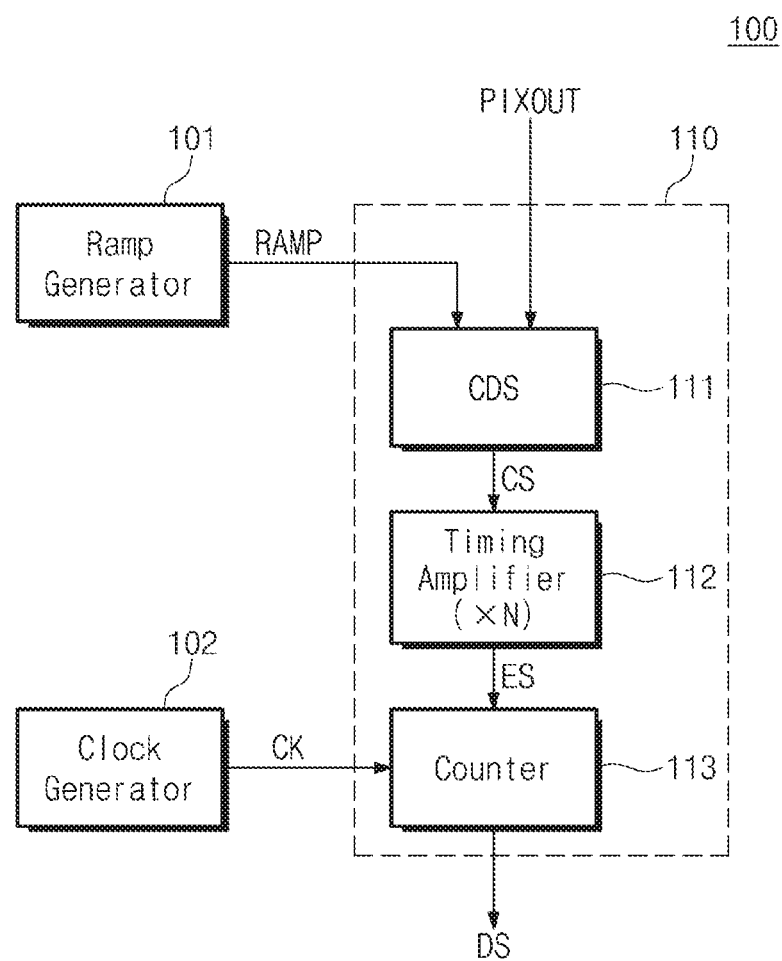
FIG. 4 is a block diagram illustrating the ADC circuit of FIG. 3 in detail, according to an exemplary embodiment of the inventive concept.

FIG. 4 is a block diagram illustrating the ADC circuit 100 of FIG. 3 in detail, according to an exemplary embodiment of the inventive concept. For convenience of description and for brevity of illustration, a structure of only the first ADC 110 is illustrated in FIG. 4. In addition, for convenience of description, the first ADC 110 may hereinafter be referred to as an "ADC 110". The remaining ADCs included in the ADC circuit 100 may also have a structure similar to the ADC 110 of FIG. 4. However, the inventive concept is not limited thereto.

Referring to FIG. 4, the ADC circuit 100 may include the ramp generator 101, the clock generator 102, and the ADC 110. The ADC 110 may include a correlated double sampling circuit (CDS) 111, a timing amplifier 112, and a counter 113. The ramp generator 101 and the clock generator 102 were described above, and thus, a detailed description thereof may not be repeated.

The CDS 111 may receive the ramp signal RAMP from the ramp generator 101 and may receive the pixel signal PIXOUT through a bit line BL. The CDS 111 may output a comparison signal CS based on the received signals. For example, the CDS 111 may output the comparison signal CS having a high level during a period where the ramp signal RAMP is higher than the pixel signal PIXOUT. In other words, the CDS 111 may output the comparison signal CS with the high level when the ramp signal RAMP is higher than the pixel signal PIXOUT. Below, for convenience of description, a period where the comparison signal CS has a high level is referred to as an "active period of the comparison signal CS". In addition, that a specific signal is activated or has an active period is assumed as the specific signal has the high level. However, the inventive concept is not limited thereto, for example, the active period may correspond to a period when a certain signal has a low level.

The timing amplifier 112 may increase an active time of the comparison signal CS. In this case, the active time may refer to a length or a time of a high level period of the comparison signal CS. For example, the active time of the comparison signal CS may be a first time. In this case, the timing amplifier 112 may increase the active time of the comparison signal CS to a second time and may output an increased comparison signal. Below, for convenience of description, a signal, the active period of which is increased, may be referred to as an "extended signal ES". In other words, the extended signal ES may refer to a signal that is obtained by increasing an active time of a specific signal (e.g., the comparison signal CS) or a signal output from the timing amplifier 112.

The active time of the extended signal ES may be the second time, and the second time may be "N" times the first time (N being a positive integer). In other words, the timing amplifier 112 may increase the active time of the comparison signal CS by "N" times to produce the extended signal ES.

The counter 113 may receive the clock signal CK from the clock generator 102 and may receive the extended signal ES from the timing amplifier 112. The counter 113 may perform a counting operation based on the extended signal ES and the clock signal CK to output the digital signal DS. In an exemplary embodiment of the inventive concept, the digital signal DS may include digital bit values or digital data, which correspond to the size of the pixel signal PIXOUT.

In an exemplary embodiment of the inventive concept, the active time of the comparison signal CS corresponds to a level of the pixel signal PIXOUT. In the case where the timing amplifier 112 according to an exemplary embodiment of the inventive concept is absent, a counter may receive a comparison signal from a CDS and may generate a digital signal based on the comparison signal and a clock signal. In this case, since a clock signal of a relatively high frequency is used to support a specific resolution, power consumption may increase due to a high-speed clock signal.

In contrast, the ADC circuit 100 according to an exemplary embodiment of the inventive concept may increase the active time of the comparison signal CS from the CDS 111 to generate the extended signal ES and may perform a counting operation based on the generated extended signal ES. Accordingly, the specific resolution may be supported even though the digital signal DS is generated on the basis of a clock signal, which has a lower frequency than that of a clock signal used when the timing amplifier 112 is absent. Accordingly, power consumption of the ADC circuit 100 may be reduced while the same resolution is supported.

Figure 5:
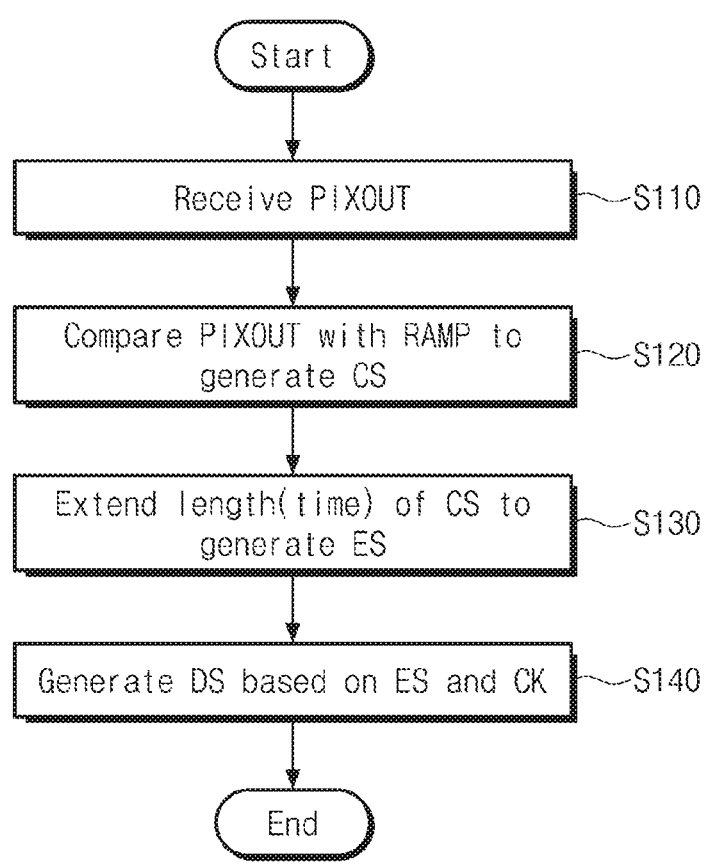
FIG. 5 is a flowchart illustrating an operation of the ADC of FIG. 4, according to an exemplary embodiment of the inventive concept.

FIG. 5 is a flowchart illustrating an operation of the ADC 110 of FIG. 4, according to an exemplary embodiment of the inventive concept. Referring to FIGS. 4 and 5, in operation S110, the ADC 110 may receive the pixel signal PIXOUT. For example, as described above, the ADC 110 may receive the pixel signal PIXOUT from the pixel PIX of the pixel array 11 through the bit line BL. However, the inventive concept may not be limited thereto. For example, the ADC 110 may receive a sensor signal or an analog signal from another sensor (e.g., a proximity sensor, a touch sensor, or an illumination sensor), another device, or a device that outputs an analog signal.

In operation S120, the ADC 110 may compare the pixel signal PIXOUT and the ramp signal RAMP to generate the comparison signal CS. For example, the CDS 111 of the ADC 110 may compare the ramp signal RAMP and the pixel signal PIXOUT and may output the comparison signal CS as the comparison result. In other words, as described above, the CDS 111 may output the comparison signal CS having a high level during a period where the ramp signal RAMP is greater than the pixel signal PIXOUT. However, the inventive concept may not be limited thereto. For example, the comparison signal CS may be variously changed or modified such that it is output with the high level during a period where the ramp signal RAMP is less than the pixel signal PIXOUT.

In operation S130, the ADC 110 may increase the active time of the comparison signal CS to generate the extended signal ES. For example, the timing amplifier 112 of the ADC 110 may receive the comparison signal CS and may increase or extend the active time of the received comparison signal CS as much as "N" times. In other words, the active time of the extended signal ES may be "N" times longer than the active time of the comparison signal CS.

In operation S140, the ADC 110 may generate the digital signal DS based on the extended signal ES and the clock signal CK. In other words, the ADC 110 may generate the digital signal DS in response to the extended signal ES and the clock signal CK. For example, the counter 113 of the ADC 110 may count the clock signal CK during the active time of the extended signal ES and may generate the digital signal DS based on the counting result.

Figure 6A:
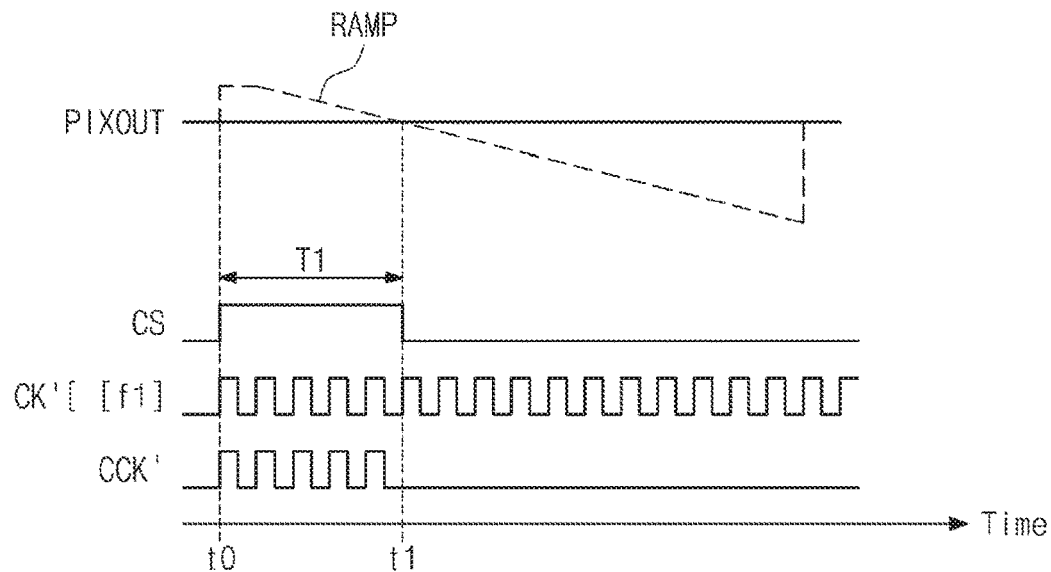
FIGS. 6A and 6B are timing diagrams for describing an operation of the ADC of FIG. 4, according to an exemplary embodiment of the inventive concept.
Figure 6B:
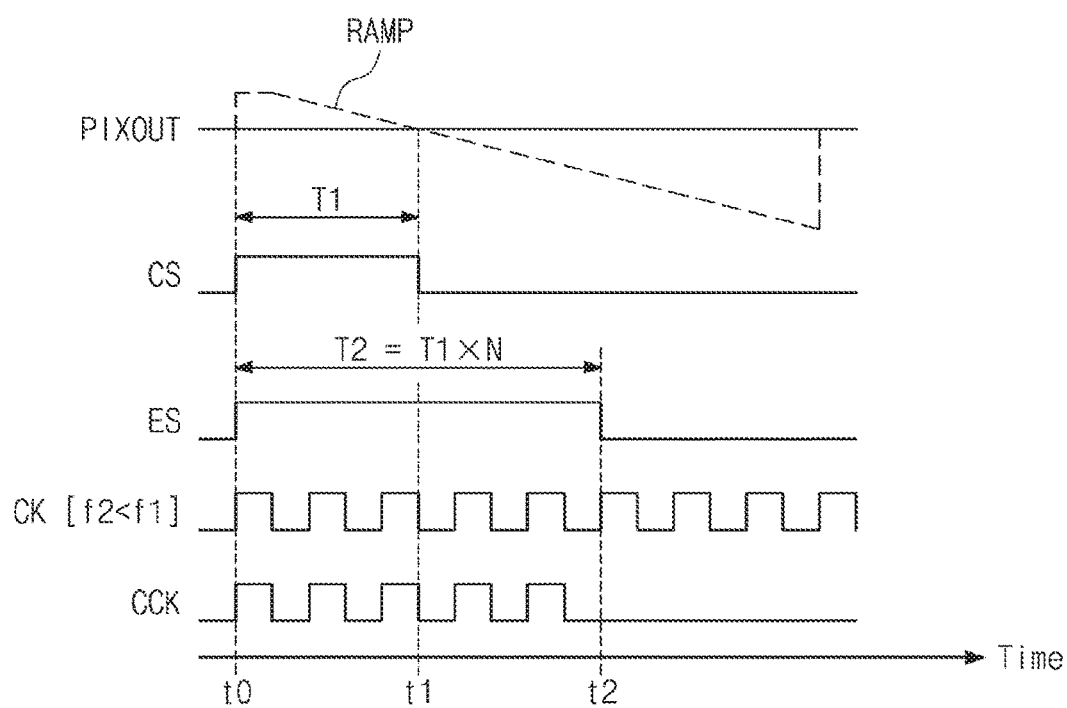

FIGS. 6A and 6B are timing diagrams for describing an operation of the ADC 110 of FIG. 4, according to an exemplary embodiment of the inventive concept. Hereinafter, an operation of a general ADC will be described with reference to FIG. 6A, and an operation of the ADC 110 according to an exemplary embodiment of the inventive concept will be described with reference to FIG. 6B. For clarity of description, it is assumed that the pixel signal PIXOUT and the ramp signal RAMP are the same in FIGS. 6A and 6B.

Below, for convenience of description, it is assumed that the ramp signal RAMP is a signal that has a specific slope and decreases during a specific time. However, the inventive concept may not be limited thereto. For example, the ramp signal RAMP may be variously changed or modified.

Referring to FIG. 6A, the comparison signal CS may be activated during a period where the ramp signal RAMP is greater than the pixel signal PIXOUT. In this case, the active time of the comparison signal CS may be a first time T1. In other words, the comparison signal CS may be activated during the first time T1 from a 0th time point t0 to a first time point t1.

An ADC may generate a counting clock signal CCK' based on the comparison signal CS and a clock signal CK'. The counting clock signal CCK' may be the clock signal CK' during the active time T1 of the comparison signal CS.

The ADC may count the number of clocks of the counting clock signal CCK' to generate the digital signal DS. The number of clocks of the counting clock signal CCK' illustrated in FIG. 6A may be "5". In this case, the digital signal DS may be bit values or data values corresponding to a value of "5".

Referring to FIGS. 4 and 6B, the CDS 111 of the ADC 110 may generate the comparison signal CS based on the ramp signal RAMP and the pixel signal PIXOUT. In this case, the comparison signal CS may be activated during a period where the ramp signal RAMP is greater than the pixel signal PIXOUT. The active time of the comparison signal CS may be the first time T1. In other words, the comparison signal CS may be activated during the first time T1 from the 0th time point t0 to the first time point t1.

The timing amplifier 112 of the ADC 110 may increase the active time of the comparison signal CS as much as "N" times, to output the extended signal ES. In this case, the active time of the extended signal ES may be a second time T2. The second time T2 may be "N" times longer than the first time T1. For example, the second time may be represented as follows: T2=T1×N. In other words, the extended signal ES may be activated from the 0th time point t0 to a second time point t2.

The counter 113 of the ADC 113 may generate a counting clock signal CCK based on the extended signal ES and the clock signal CK. The counting clock signal CCK may be the clock signal CK during the active time T2 of the extended signal ES. In other words, the counting clock signal CCK may be the same as the clock signal CK for the second time T2.

The counter 113 of the ADC 110 may count the number of clocks of the counting clock signal CCK to generate the digital signal DS. As illustrated in FIG. 6B, the number of clocks of the counting clock signal CCK may be "5". In this case, the generated digital signal DS may be bit values or data values corresponding to a value of "5".

In an exemplary embodiment of the inventive concept, the frequency of the clock signal CK and the counting clock signal CCK of FIG. 6B may be lower than the frequency of the clock signal CK' and the counting clock signal CCK' of FIG. 6A. In other words, the clock signal CK' of FIG. 6A may have a first frequency f1, and the clock signal CK of FIG. 6B according to an exemplary embodiment of the inventive concept may have a second frequency f2 lower than the first frequency f1. In other words, according to an exemplary embodiment of the inventive concept, as the length of the comparison signal CS is increased "N" times, the same digital signal DS may be output even though a clock signal of a relatively low frequency is used. In other words, according to an exemplary embodiment of the inventive concept, the same resolution may be supported with respect to a pixel signal (e.g., PIXOUT) even though a clock signal (e.g., CK) of a relatively low frequency is used. Since a frequency of the clock signal CK becomes lower, power consumption may be reduced.

In an exemplary embodiment of the inventive concept, to support the same resolution as the case where the timing amplifier 112 is absent, the frequency f2 of the clock signal CK may be "1/N" times the first frequency f1. However, the inventive concept is not limited thereto. In an exemplary embodiment of the inventive concept, the ADC circuit 100 may further include a clock divider that is configured to divide a clock signal from the clock generator 102.

Figure 7:
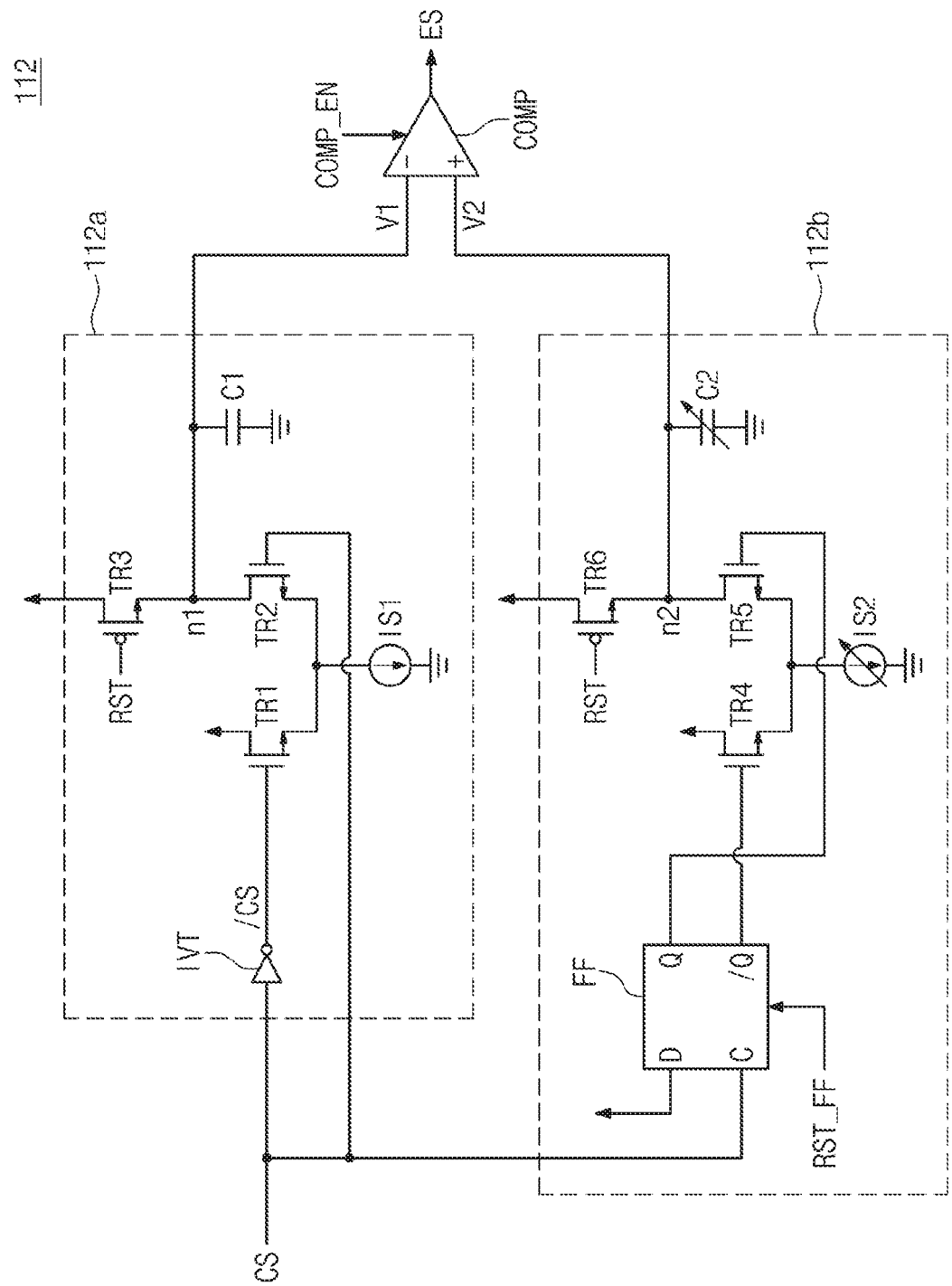
FIG. 7 is a block diagram illustrating a timing amplifier of FIG. 4, according to an exemplary embodiment of the inventive concept.

FIG. 7 is a block diagram illustrating the timing amplifier 112 of FIG. 4, according to an exemplary embodiment of the inventive concept. The timing amplifier 112 illustrated in FIG. 7 is merely exemplary, and a structure of the timing amplifier 112 may be variously modified. Referring to FIGS. 4 and 7, the timing amplifier 112 may include a first voltage control unit 112a, a second voltage control unit 112b, and a comparator COMP.

The first voltage control unit 112a may control a first voltage V1 of a first node n1 in response to the comparison signal CS. The first voltage control unit 112a may include an inverter IVT, first to third transistors TR1, TR2 and TR3, a first current source IS1, and a first capacitor C1.

The inverter IVT may receive the comparison signal CS, invert the received comparison signal CS, and output an inverted comparison signal /CS. The first transistor TR1 may be connected between a first end of the first current source IS1 and a power supply voltage and may operate in response to the inverted comparison signal /CS provided from the inverter IVT. A second end of the first current source IS1 may be connected with a ground terminal. The second transistor TR2 may be connected between the first end of the first current source IS1 and the first node n1 and may operate in response to the comparison signal CS. Thus, the first current source IS1 may control a voltage of the first node n1 by operations of the first and second transistors TR1 and TR2. In other words, the first current source IS1 may control a voltage of the first node n1 in response to the comparison signal CS. The third transistor TR3 may be connected between the power supply voltage and the first node n1 and may operate in response to a reset signal RST. In an exemplary embodiment of the inventive concept, the reset signal RST may be a signal that is provided from a separate control circuit or the sensor controller 13 of FIG. 1. The first capacitor C1 is connected between the first node n1 and a ground terminal. The first capacitor C1 may be discharged or charged by an operation of the third transistor TR3. In other words, the first capacitor C1 may control the voltage of the first node n1 in response to the reset signal RST.

The second voltage control unit 112b may control a second voltage V2 of a second node n2 in response to the comparison signal CS. The second voltage control unit 112b may include a flip-flop FF, fourth to sixth transistors TR4, TR5 and TR6, a second current source IS2, and a second capacitor C2.

The flip-flop FF may be a D flip-flop. The flip-flop FF may receive the comparison signal CS (at a clock terminal) and output first and second output signals Q and /Q in response to the received comparison signal CS.

The fourth transistor TR4 may be connected between a first end of the second current source IS2 and the power supply voltage and may operate in response to the second output signal /Q. The fifth transistor TR5 may be connected between the first end of the second current source IS2 and the second node n2 and may operate in response to the first output signal Q. A second end of the second current source IS2 may be connected with the ground terminal. Thus, the second current source IS2 may control a voltage of the second node n2 by operations of the fourth and fifth transistors TR4 and TR5. In other words, the second current source IS2 may control a voltage of the second node n2 in response to the comparison signal CS. The sixth transistor TR6 may be connected between the power supply voltage and the second node n2 and may operate in response to the reset signal RST. The second capacitor C2 is connected between the second node n2 and the ground terminal. The second capacitor C2 may be discharged or charged by an operation of the sixth transistor TR6. In other words, the second capacitor C2 may control the voltage of the second node n2 in response to the reset signal RST.

The comparator COMP may compare the first voltage V1 of the first node n1 and the second voltage V2 of the second node n2 in response to a comparator enable signal COMP_EN and output the extended signal ES as the comparison result.

Figure 8A:
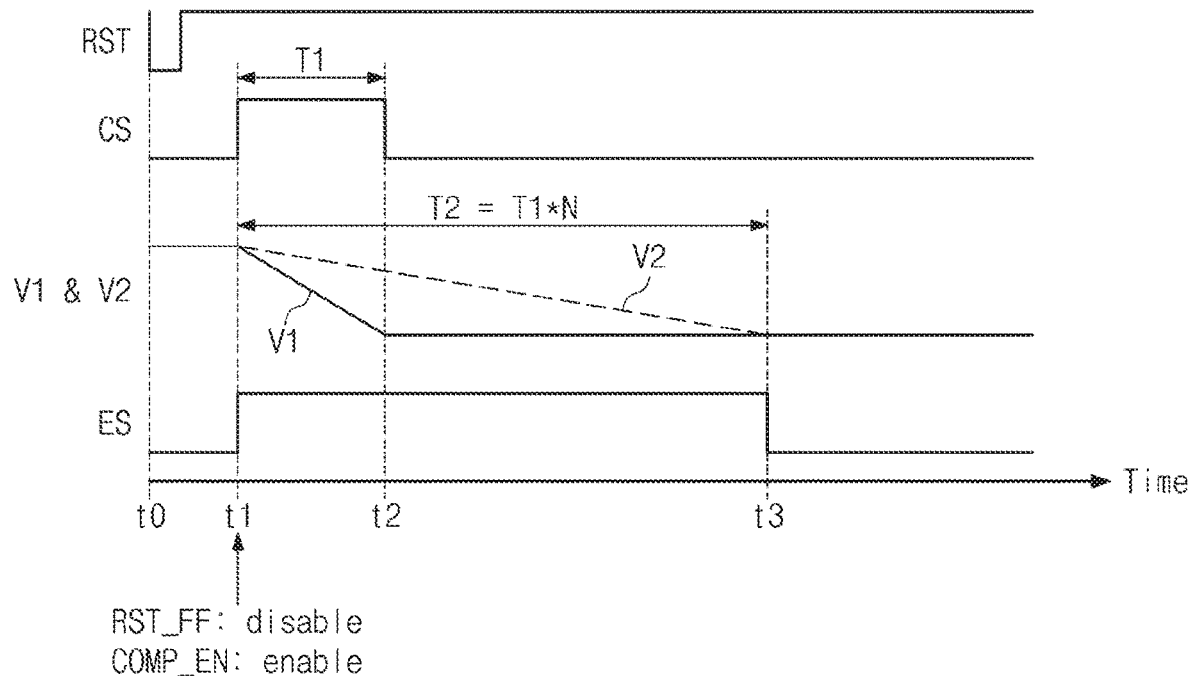
FIGS. 8A and 8B are timing diagrams for describing an operation of the timing amplifier of FIG. 7, according to an exemplary embodiment of the inventive concept.
Figure 8B:
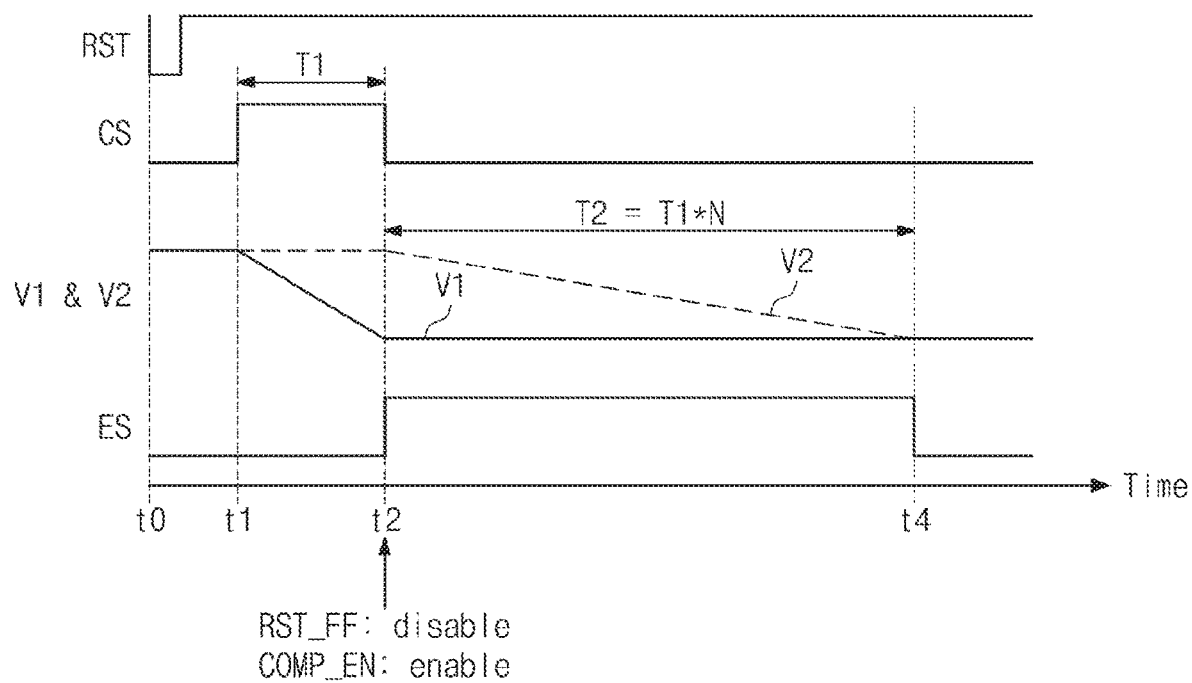

FIGS. 8A and 8B are timing diagrams for describing an operation of the timing amplifier 112 of FIG. 7, according to an exemplary embodiment of the inventive concept. Referring to FIGS. 7, 8A, and 8B, at a 0th time point t0, the third transistor TR3 of the first voltage control unit 112a and the sixth transistor TR6 of the second voltage control unit 112b may be turned on in response to the reset signal RST. As the third and sixth transistors TR3 and TR6 are turned on, the first voltage V1 of the first node n1 and the second voltage V2 of the second node n2 may be charged to a power supply voltage.

Afterwards, the comparison signal CS may be activated during a first time T1 from a first time point t1 to a second time point t2. In this case, as the second transistor TR2 of the first voltage control unit 112a is turned on during the first time T1, the first voltage V1 of the first node n1 may decrease from the power supply voltage to a specific level during the first time T1.

In an exemplary embodiment of the inventive concept, a time point to output the extended signal ES may be adjusted by controlling a flip-flop reset signal RST_FF and the comparator enable signal COMP_EN. For example, as illustrated in FIG. 8A, at the first time point t1, the flip-flop reset signal RST_FF may be deactivated (e.g., disabled), and the comparator enable signal COMP_EN may be activated (e.g., enabled). As the flip-flop reset signal RST_FF is deactivated and the comparison signal CS transitions to the high level, the first output signal Q of the flip-flop FF may be set to the high level, and the second output signal /Q of the flip-flop FF may be set to a low level. Afterwards, the levels of the first and second output signals Q and /Q may be maintained until the flip-flop reset signal RST_FF is activated.

The fourth transistor TR4 may be turned off in response to the second output signal /Q, and the fifth transistor TR5 may be turned on in response to the first output signal Q. As the fifth transistor TR5 is turned on, the second voltage V2 of the second node n2 may decrease to a specific level until a third time point t3. In this case, the comparator COMP may output the extended signal ES activated from the first time point t1 to the third time point t3, in response to the comparator enable signal COMP_EN.

Alternatively, as illustrated in FIG. 8B, at the second time point t2, as the flip-flop reset signal RST_FF is deactivated and the comparison signal CS transitions to the high level, the first output signal Q of the flip-flop FF may be set to the high level, and the second output signal /Q of the flip-flop may be set to a low level. Afterwards, the levels of the first and second output signals Q and /Q may be maintained until the flip-flop reset signal RST_FF is activated.

The fourth transistor TR4 may be turned off in response to the second output signal /Q, and the fifth transistor TR5 may be turned on in response to the first output signal Q. As the fifth transistor TR5 is turned on, the second voltage V2 may decrease to a specific level during a second time T2 from the second time point t2 to a fourth time point t4. In this case, the comparator COMP may output the extended signal ES activated from the second time point t2 to the fourth time point t4, in response to the comparator enable signal COMP_EN. As illustrated in FIGS. 8A and 8B, a time point to output the extended signal ES may be adjusted by controlling timings of internal signals (e.g., the flip-flop reset signal RST_FF or the comparator enable signal COMP_EN).

In an exemplary embodiment of the inventive concept, as illustrated in FIGS. 8A and 8B, a slope (e.g., a decreasing slope) at which the second voltage V2 decreases may be different from a slope at which the first voltage V1 decreases. For example, the decreasing slope of the first voltage V1 (e.g., a rate at which a voltage level decreases) may be determined according to a characteristic of the first current source IS1 or the first capacitor C1. The decreasing slope of the second voltage V2 may be determined according to a characteristic of the second current source IS2 or the second capacitor C2.

In other words, the decreasing slope of the second voltage V2 may be controlled by adjusting a current amount of the second current source IS2 or the capacitance of the second capacitor C2. As such, a time point (e.g., the third time point t3 or the fourth time point t4) when the second voltage V2 reaches a specific voltage may be adjusted by controlling the decreasing slope of the second voltage V2. In other words, the active time T2 or an extension ratio "N" of the extended signal ES may be controlled by adjusting the current amount of the second current source IS2 or the capacitance of the second capacitor C2. Thus, as illustrated in FIGS. 8A and 8B, a time point to output the extended signal ES may be adjusted by controlling internal signals. In addition, the active time T2 or the extension ratio "N" of the extended signal ES may be controlled by controlling characteristics of internal elements of the timing amplifier 112. In an exemplary embodiment of the inventive concept, various control signals (RST, RST_FF, COMP_EN, and the like) illustrated in FIG. 7 may be generated by the sensor controller 13 (refer to FIG. 1) or a separate control circuit.

Figure 9A:
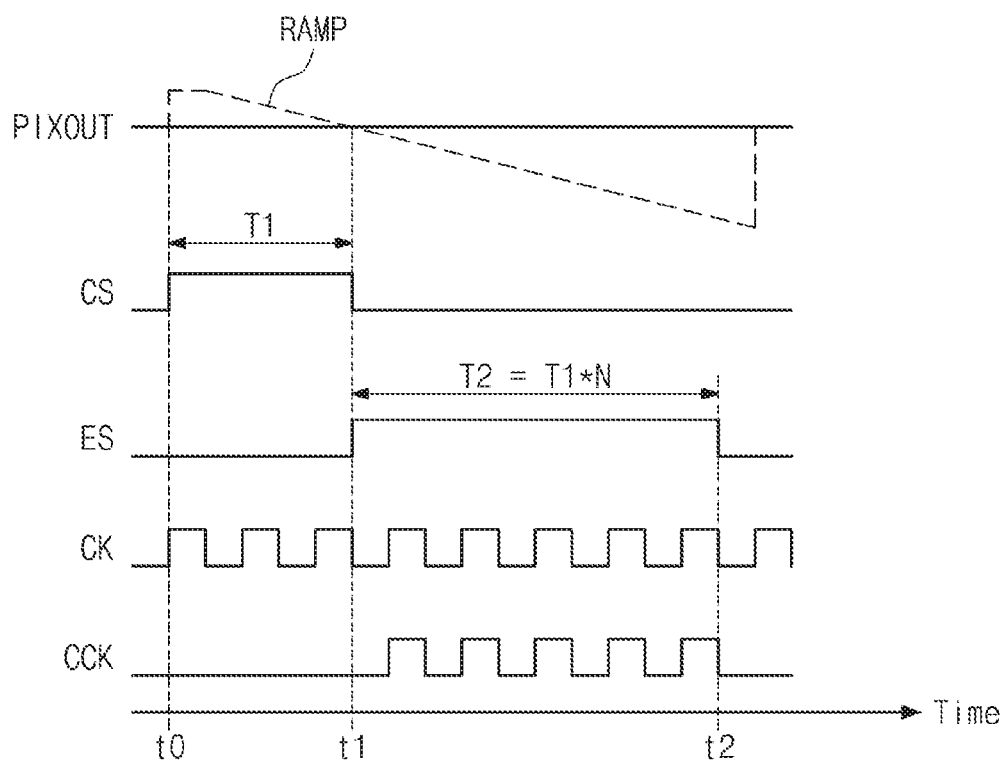
FIGS. 9A and 9B are timing diagrams for describing an operation of the ADC of FIG. 4, according to an exemplary embodiment of the inventive concept.
Figure 9B:
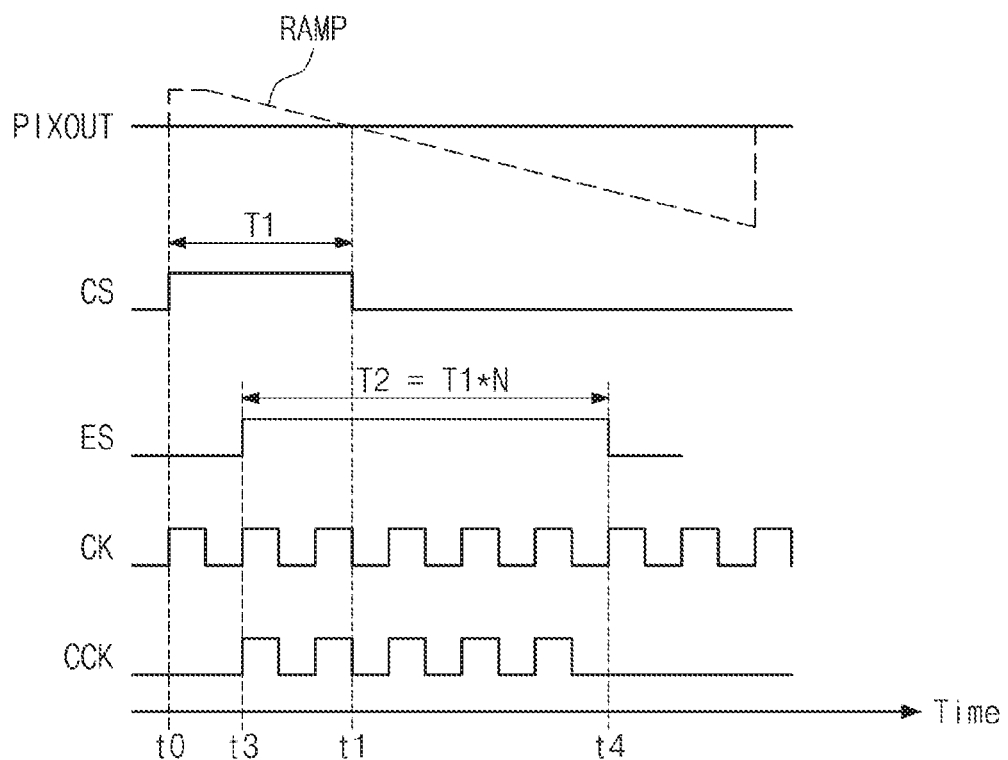

FIGS. 9A and 9B are timing diagrams for describing an operation of the ADC 110 of FIG. 4, according to an exemplary embodiment of the inventive concept. A case in which the extended signal ES is activated at different time points will be described with reference to FIGS. 9A and 9B. However, the inventive concept is not limited thereto.

Referring to FIGS. 4, 9A, and 9B, the CDS 111 may output the comparison signal CS having an active period corresponding to a first time T1 from a 0th time point t0 to a first time point t1 based on the pixel signal PIXOUT and the ramp signal RAMP.

As illustrated in FIG. 9A, the timing amplifier 112 may output the extended signal ES having an active period corresponding to a second time T2 from a time point (e.g., the first time point t1) when the active period of the comparison signal CS ends to a second time point t2. Here, the second time T2 may be "N" times the first time T1.

In the embodiment described with reference to FIG. 6B, the timing amplifier 112 may be controlled such that the extended signal ES is activated at a time point (e.g., the 0th time point t0) when the comparison signal CS is activated. Unlike the above description with reference to FIG. 6B, in the embodiment of FIG. 9B, the timing amplifier 112 may be controlled such that the extended signal ES is activated at a time point (e.g., the first time point t1) when the active period of the comparison signal CS ends. In other words, the timing amplifier 112 may be controlled as described with reference to FIG. 8B.

The counter 113 may generate the counting clock signal CCK based on the extended signal ES and the clock signal CK and may generate a digital signal based on the counting clock signal CCK. A description associated with this function of the counter 113 is given above, and thus, a detailed description thereof will not be repeated.

As illustrated in FIG. 9B, the timing amplifier 112 may activate the extended signal ES before a time point (e.g., the first time point t1) when the active period of the comparison signal CS ends. In this case, the extended signal ES may start to be activated at a third time point t3. In other words, the comparison signal CS may be activated during the second time T2 from the third time point t3 to a fourth time point t4. Here, the third time point t3 may be included within an active period of the comparison signal CS. In other words, at the third time point t3 belonging to the active period of the comparison signal CS, the flip-flop reset signal RST_FF may be deactivated, and the comparator enable signal COMP_EN may be activated.

As described above, a time point to output the extended signal ES may be controlled by deactivating the flip-flop reset signal RST_FF and activating the comparator enable signal COMP_EN.

The time points to output the extended signal ES described with reference to FIGS. 6B, 8A, 8B, 9A, and 9B are merely exemplary, and thus, the inventive concept may not be limited thereto. For example, a time point to output the extended signal ES may be variously modified depending on a particular implementation.

Figure 10:
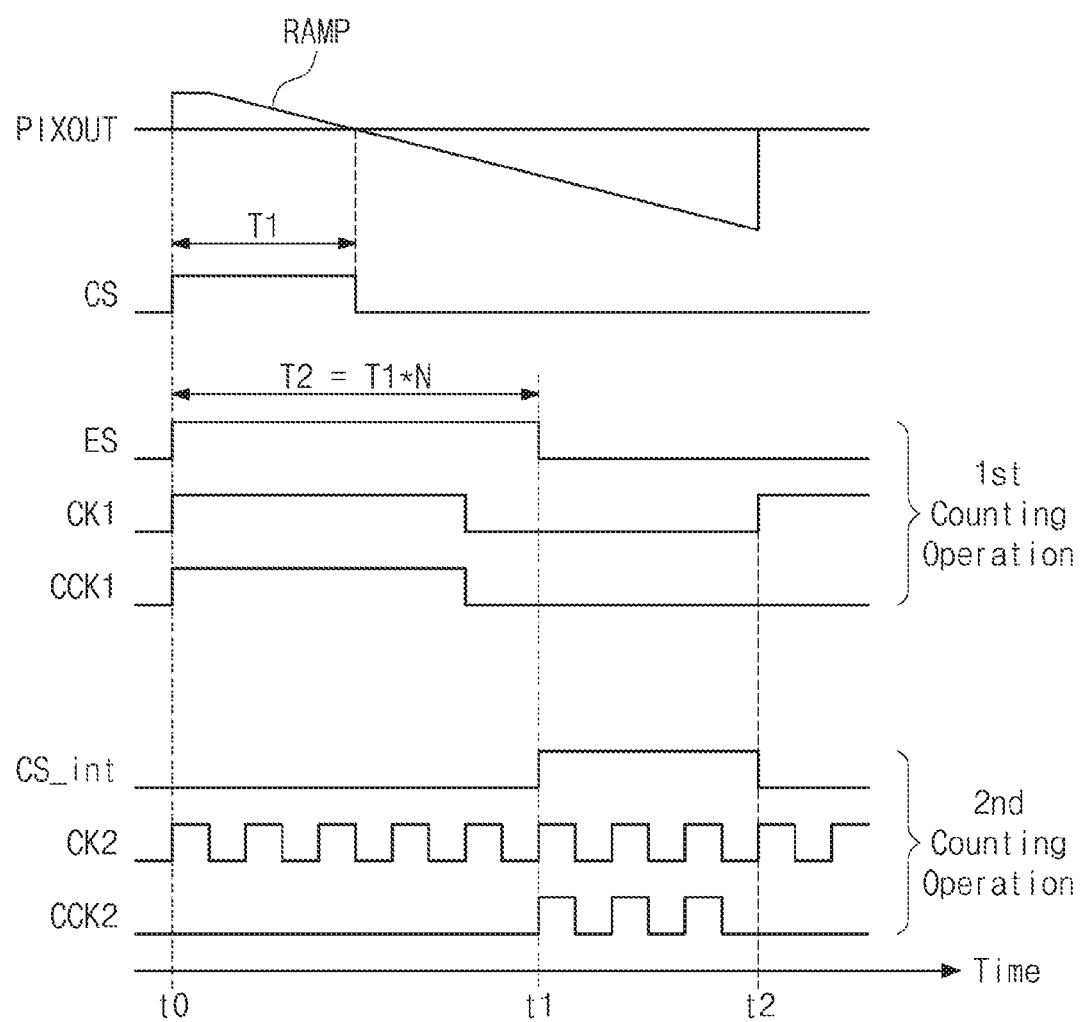
FIG. 10 is a timing diagram for describing another operation of an ADC of FIG. 4, according to an exemplary embodiment of the inventive concept.

FIG. 10 is a timing diagram for describing an operation of the ADC of FIG. 4, according to an exemplary embodiment of the inventive concept. In the present embodiment, the counter 113 of the ADC 110 of FIG. 4 may operate as a 2-step counter. In an exemplary embodiment of the inventive concept, the 2-step counter may refer to a counter that performs first and second counting operations to generate a digital signal. Here, the first counting operation may be a counting operation associated with upper bits (e.g., most significant bits (MSB)) of the digital signal, and the second counting operation may be a counting operation associated with lower bits (e.g., least significant bits (LSB)) of the digital signal. In an exemplary embodiment of the inventive concept, the digital signal may be obtained by combining a result value of the first counting operation and a result value of the second counting operation. However, the inventive concept is not limited thereto.

For brevity of illustration, it is assumed that the extended signal ES is activated at the same time point as the comparison signal CS. In other words, it is assumed that the timing amplifier 112 outputs the extended signal ES based on the operation method described with reference to FIG. 8A. However, the inventive concept may not be limited thereto. For example, a time point to activate or output the extended signal ES may be variously modified according to the operation of the timing amplifier 112.

Referring to FIGS. 4 and 10, the comparison signal CS may be activated during a first time T1. The timing amplifier 112 may increase an active time of the comparison signal CS to output the extended signal ES.

The counter 113 may perform the first counting operation based on the extended signal ES and a first clock signal CK1. For example, the first clock signal CK1 may be provided from the clock generator 102. The counter 113 may generate a first counting clock signal CCK1 based on the extended signal ES and the first clock signal CK1. The counter 113 may count the number of clocks of the first counting clock signal CCK1 to generate a first bit value. In an exemplary embodiment of the inventive concept, the first bit value may correspond to an upper bit value of the digital signal DS, which is output last.

The counter 113 may generate an internal comparison signal CS_int based on the extended signal ES and the first clock signal CK1. For example, the internal comparison signal CS_int may be a signal for the second counting operation. The internal comparison signal CS_int may be a signal that is activated from a time point (e.g., a first time point t1) when the extended signal ES is deactivated to a next rising edge (e.g., a second time point t2) of the first clock signal CK1.

The counter 113 may perform the second counting operation based on the generated internal comparison signal CS_int and a second clock signal CK2. For example, the second clock signal CK2 may be provided from the clock generator 102. A frequency of the second clock signal CK2 may be higher than a frequency of the first clock signal CK1. The counter 113 may generate a second counting clock signal CCK2 based on the internal comparison signal CS_int and the second clock signal CK2. The counter 113 may count the number of clocks of the second counting clock signal CCK2 to generate a second bit value. In an exemplary embodiment of the inventive concept, the second bit value may correspond to an upper bit value of the digital signal DS, which is output last.

In an exemplary embodiment of the inventive concept, the digital signal DS may be finally determined by combining (e.g., subtracting) the first bit value and the second bit value. It is assumed that the finally output digital signal DS is a 4-bit signal, e.g., a binary code. For example, the first bit value may be a value corresponding to "1000" that means one clock of the first counting clock signal CCK1, and the second bit value may be a value corresponding to "0011" that means three clocks of the second counting clock signal CCK2. In the case of subtracting the second bit value from the first bit value, the final digital signal DS may correspond to "0101". However, these numerical values are merely exemplary, and the inventive concept may not be limited thereto.

In an exemplary embodiment of the inventive concept, to obtain the same value as the above-described digital signal DS in an ADC circuit from which the timing amplifier 112 is absent, there is a need to perform the first counting operation by using a clock signal faster than the first clock signal CK1 and perform the second counting operation by using a clock signal faster than the second clock signal CK2. In other words, the use of fast clock signals may cause an increase in power consumption. According to an exemplary embodiment of the inventive concept, however, the ADC circuit 100 can decrease power consumption by using by using a relatively slow clock signals.

Figure 11:
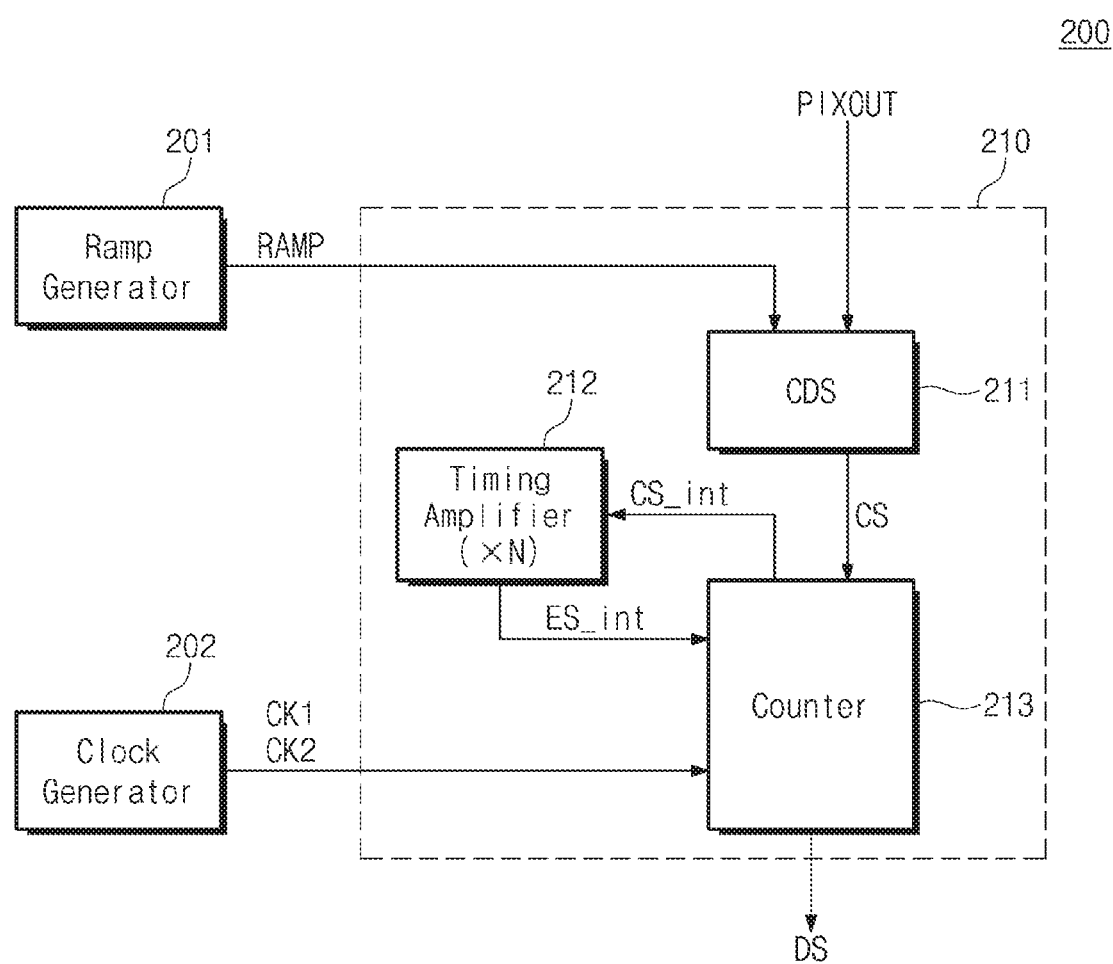
FIG. 11 is a block diagram illustrating the ADC circuit according to an exemplary embodiment of the inventive concept.
Figure 12A:
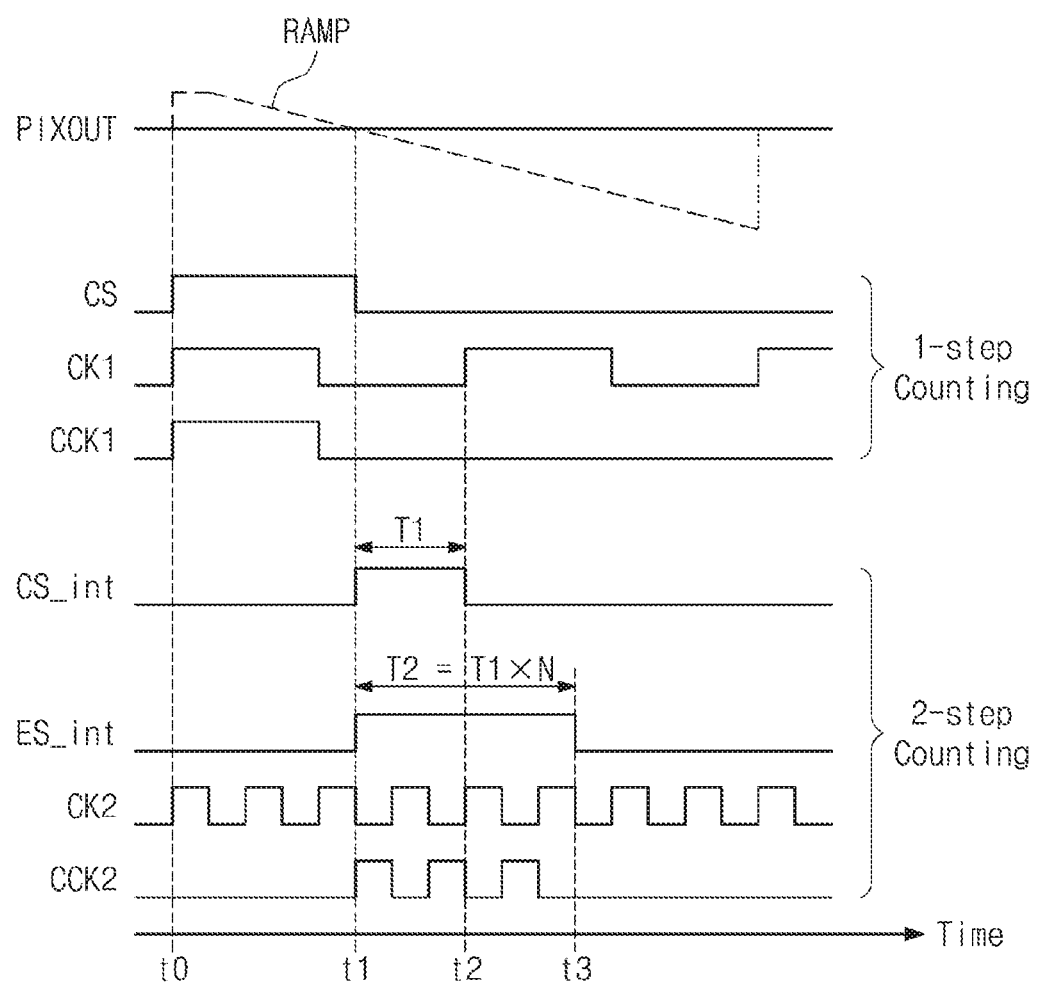
FIGS. 12A and 12B are timing diagrams for describing an operation of the ADC circuit of FIG. 11, according to an exemplary embodiment of the inventive concept.
Figure 12B:
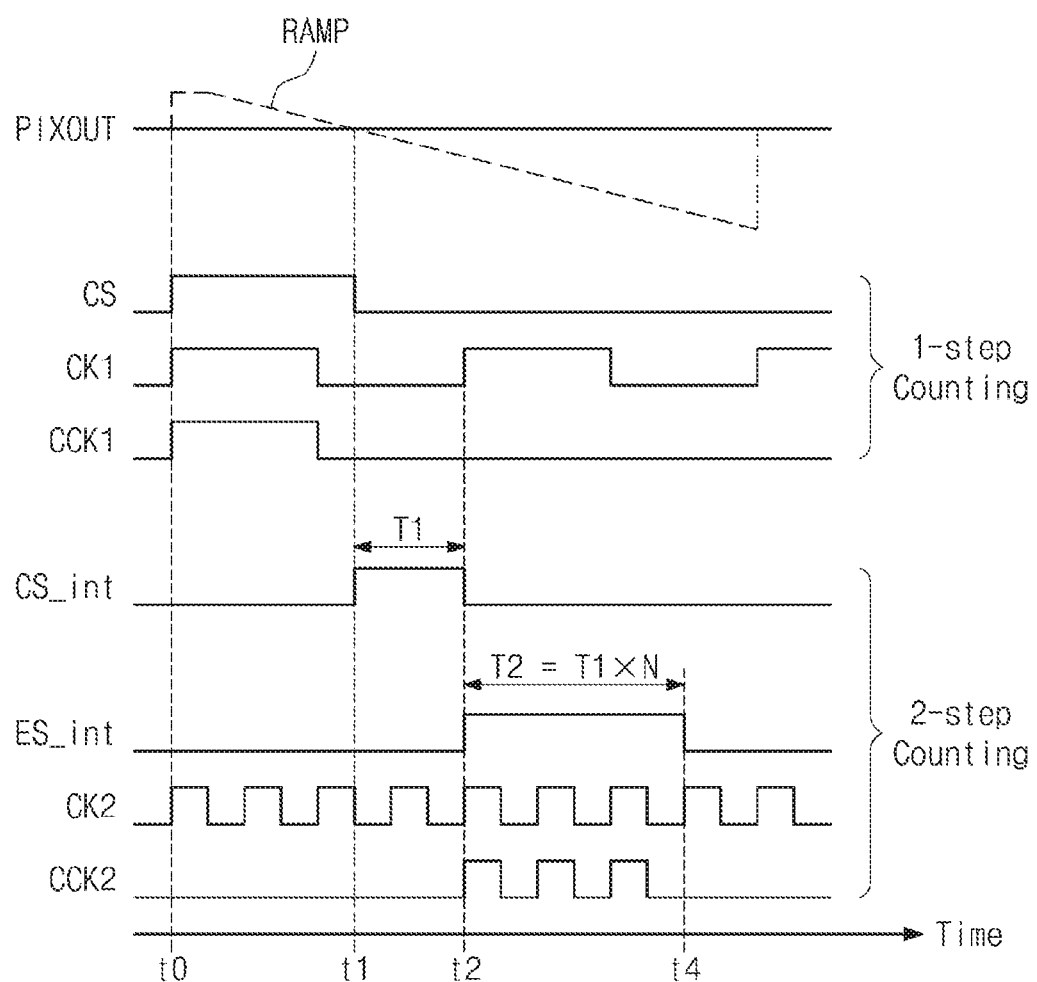

FIG. 11 is a block diagram illustrating an ADC circuit 200 according to an exemplary embodiment of the inventive concept. FIGS. 12A and 12B are timing diagrams for describing an operation of the ADC circuit 200 of FIG. 11, according to an exemplary embodiment of the inventive concept. Referring to FIG. 11, the ADC circuit 200 may include a ramp generator 201, a clock generator 202, a CDS 211, a timing amplifier 212, and a counter 213. The ramp generator 201, the clock generator 202, the CDS 211, and the counter 213 correspond to those described above, and thus, a detailed description thereof will not be repeated.

In an exemplary embodiment of the inventive concept, the counter 213 may be a 2-step counter that operates as described with reference to FIG. 10. In other words, the counter 213 may perform a first counting operation to obtain an upper bit value of the digital signal DS and a second counting operation to obtain a lower bit value of the digital signal DS and may generate the digital signal DS based on a result of the first and second counting operations.

For example, as illustrated in FIG. 12A, the counter 213 may generate the first counting clock signal CCK1 based on the comparison signal CS and the first clock signal CK1 and may generate a first bit value based on the number of clocks of the first counting clock signal CCK1. In other words, the counter 213 may perform the first counting operation based on the comparison signal CS and the first clock signal CK1.

The counter 213 may generate the internal comparison signal CS_int based on the comparison signal CS and the first clock signal CK1. The internal comparison signal CS_int may be activated during a first time T1 from a time point (e.g., a first time point t1) when the comparison signal CS is deactivated to a next rising edge (e.g., a second time point t2) of the first clock signal CK1.

The timing amplifier 212 may increase an active time (e.g., the first time T1) of the internal comparison signal CS_int as much as "N" times. For example, as illustrated in FIG. 12A, the timing amplifier 112 may allow the internal comparison signal CS_int to be activated during a second time T2 from the first time point t1 to a third time point t3.

The counter 213 may generate the second counting clock signal CCK2 based on the internal comparison signal CS_int and the second clock signal CK2 and may generate a second bit value based on the number of clocks of the second counting clock signal CCK2. In other words, the counter 213 may perform the second counting operation based on the internal comparison signal CS_int and the second clock signal CK2. The counter 213 may generate and output the digital signal DS based on the first and second bit values as results of the first and second counting operations.

As illustrated in FIG. 12B, the timing amplifier 112 may allow the internal extended signal ES_int to be activated during the second time T2 from a second time point t2 to a fourth time point t4. Techniques for controlling active time points, such as active time points of the internal extended signal ES_int of FIGS. 12A and 12B, are described above, and thus, detailed descriptions thereof will not be repeated.

As described above, the ADC circuit 200 may perform a 2-step counting operation to convert the pixel signal PIXOUT to the digital signal DS. In an exemplary embodiment of the inventive concept, the ADC circuit 200 may extend an active time of an internal comparison signal generated during a 2-step counting operation, thereby making it possible to support a specific resolution for the pixel signal PIXOUT by using a relatively slow clock signal. Accordingly, an ADC circuit having reduced power consumption is provided without reduction in performance.

Figure 13:
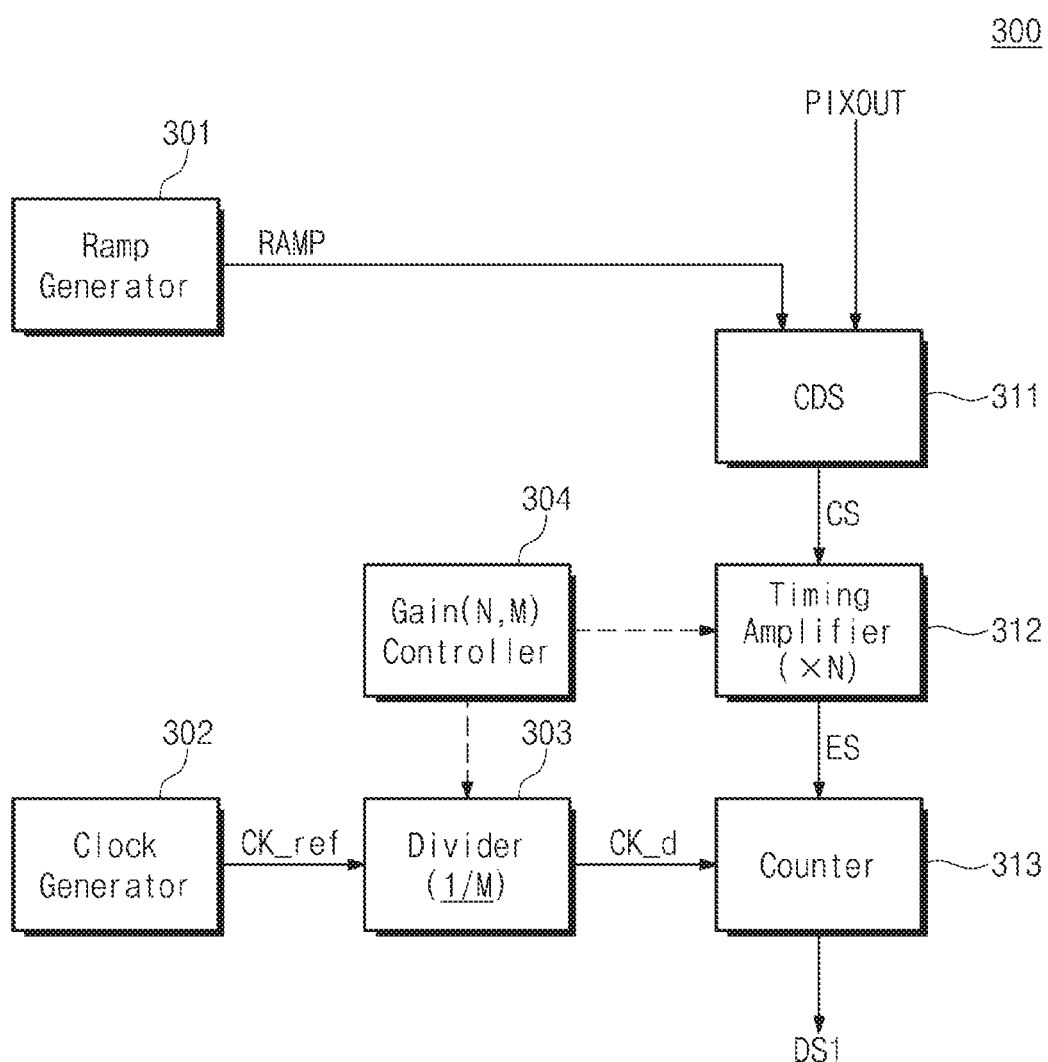
FIG. 13 is a block diagram illustrating the ADC circuit according to an exemplary embodiment of the inventive concept.

FIG. 13 is a block diagram illustrating an ADC circuit 300 according to an exemplary embodiment of the inventive concept. Referring to FIG. 13, the ADC circuit 300 may include a ramp generator 301, a clock generator 302, a divider 303, a gain controller 304, a CDS 311, a timing amplifier 312, and a counter 313. The ramp generator 301, the clock generator 302, the CDS 311, the timing amplifier 312, and the counter 313 correspond to those described above, and thus, a detailed description thereof will not be repeated.

The divider 303 may divide a reference clock signal CK_ref from the clock generator 302 by "1/M" (M being a positive integer) to output a divided clock signal CK_d. In other words, in the case where a frequency of the reference clock signal CK_ref is "f1", a frequency "f2" of the divided clock signal CK_d may be "f1/M".

The gain controller 304 may control an extension ratio "N" of the timing amplifier 312 and a division ratio "1/M" of the divider 304. For example, the gain controller 304 may control characteristics of the second current source IS2 (refer to FIG. 7) and the second capacitor C2 (refer to FIG. 7) of the timing amplifier 312, thereby adjusting the extension ratio "N". For example, the gain controller 304 may decrease a current amount of the second current source IS2 or may increase a capacitance value of the second capacitor C2, thereby increasing the extension ratio "N". Alternatively, the gain controller 304 may increase the current amount of the second current source IS2 or may decrease the capacitance value of the second capacitor C2, thereby decreasing the extension ratio "N". Under control of the gain controller 304, the timing amplifier 312 may generate the extended signal ES, and the divider 303 may generate the divided clock signal CK_d.

In an exemplary embodiment of the inventive concept, the resolution of a pixel signal may be adjusted according to the extension ratio "N" and the division ratio "1/M". For example, it may be assumed that a default resolution for the pixel signal PIXOUT is 4-bits. Under this assumption, if the extension ratio "N" and "M" of the division ratio "1/M" are set to the same value (e.g., N=M), a resolution for each pixel signal PIXOUT may be the same as the default resolution. In other words, a 4-bit digital signal may be generated. In contrast, if the extension ratio "N" is set to a value smaller than "M" of the division ratio "1/M" (e.g., N<M), a resolution for each pixel signal PIXOUT may be lower than the default resolution. Alternatively, if the extension ratio "N" is set to a value greater than "M" of the division ratio "1/M" (e.g., N>M), a resolution for each pixel signal PIXOUT may be higher the default resolution. In other words, as the extension ratio "N" and "M" of the division ratio "1/M" are adjusted, even though a slow speed clock is used, it is possible to reduce power consumption or to support a high resolution.

Figure 14A:
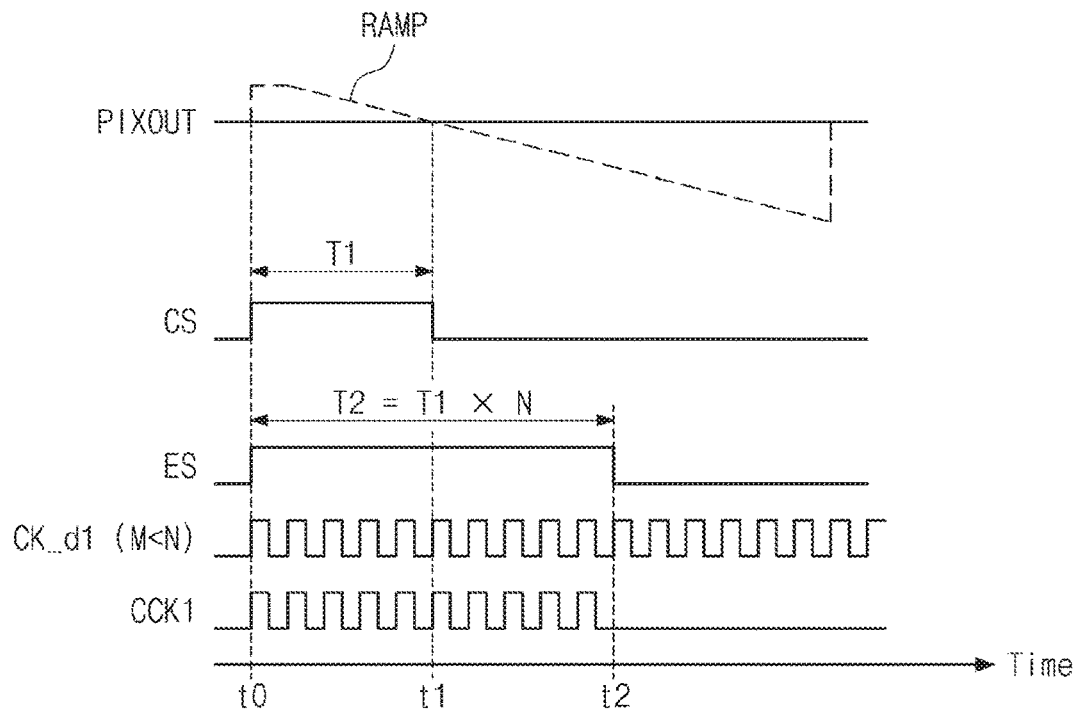
FIGS. 14A and 14B are views for describing an operation of the ADC circuit of FIG. 13, according to an exemplary embodiment of the inventive concept.
Figure 14B:
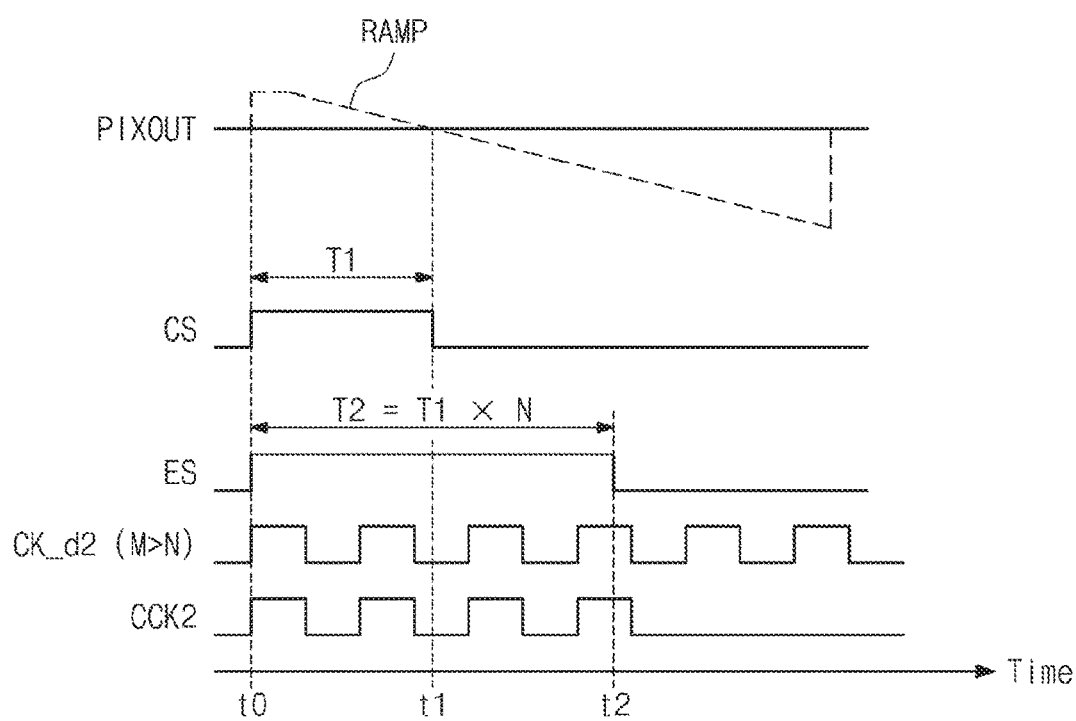

FIGS. 14A and 14B are views for describing an operation of an ADC circuit of FIG. 13, according to an exemplary embodiment of the inventive concept. An embodiment (e.g., high-resolution support) in which the extension ratio "N" is greater than "M" of the division ratio "1/M" will be described with reference to FIG. 14A, and an embodiment (e.g., low-power support) in which the extension ratio "N" is smaller than "M" of the division ratio "1/M" will be described with reference to FIG. 14B.

Referring to FIGS. 13 and 14A, the ADC 300 may generate the comparison signal CS based on the ramp signal RAMP and the pixel signal PIXOUT. The timing amplifier 312 of the ADC 300 may generate the extended signal ES based on the comparison signal CS. The comparison signal CS and the extended signal ES are described above, and thus, detailed descriptions thereof will not be repeated.

The counter 313 of the ADC circuit 300 may generate the first counting clock signal CCK1 based on the extended signal ES and a first clock signal CK_d1. Here, the first clock signal CK_d1 may be a signal that is obtained by dividing the reference clock signal CK_ref by a first division ratio "1/M" (M being smaller than N) at the divider 302. In other words, as described above, since "M" is smaller than "N", a high resolution may be supported with respect to the same pixel signal PIXOUT. For example, it may be assumed that a default resolution for each pixel signal is 4-bits, "N" is "2", and "M" is "1". In this case, an active period of the extended signal ES may increase as much as two times, compared with an active period of the comparison signal CS. Accordingly, a resolution (e.g., a 5-bit resolution), which is increased two times compared with the default resolution, may be supported during the active period of the extended signal ES.

In contrast, referring to FIGS. 13 and 14B, as in the description given with reference to FIG. 14A, the ADC circuit 300 may generate the comparison signal CS and the extended signal ES. The counter 313 of the ADC circuit 300 may generate the second counting clock signal CCK2 based on the extended signal ES and a second clock signal CK_d2. Here, the second clock signal CK_d2 may be a signal that is obtained by dividing the reference clock signal CK_ref by a second division ratio "1/M" (M being greater than N). In other words, a frequency of the second clock signal CK_d2 may be lower than a frequency of the first clock signal CK_d1 described with reference to FIG. 14A. As described above, since M is greater than N, a resolution for each pixel signal may decrease, and thus, power consumption of the ADC circuit 300 may be reduced. For example, it may be assumed that a default resolution for each pixel signal is 4-bits, "N" is "2", and "M" is "4". In this case, an active period of the extended signal ES may increase as much as two times, compared with an active period of the comparison signal CS. Accordingly, a resolution (e.g., a 3-bit resolution) decreased "½" times compared with the default resolution may be supported during the active period of the extended signal ES. The above-described numerical values are merely exemplary, and thus, the inventive concept is not limited thereto.

As described above, an ADC circuit according to an exemplary embodiment of the inventive concept may increase an active period or an active time of a comparison signal generated for signal conversion by as much as "N" times and may divide a clock signal used in a counting operation by "1/M", thereby reducing power consumption of the ADC circuit. In addition, since the extension ratio "N" and the division ratio "1/M" are controlled, a high resolution may be supported with respect to each pixel signal. Accordingly, the ADC circuit having increased performance or reduced power consumption is provided.

Figure 15:
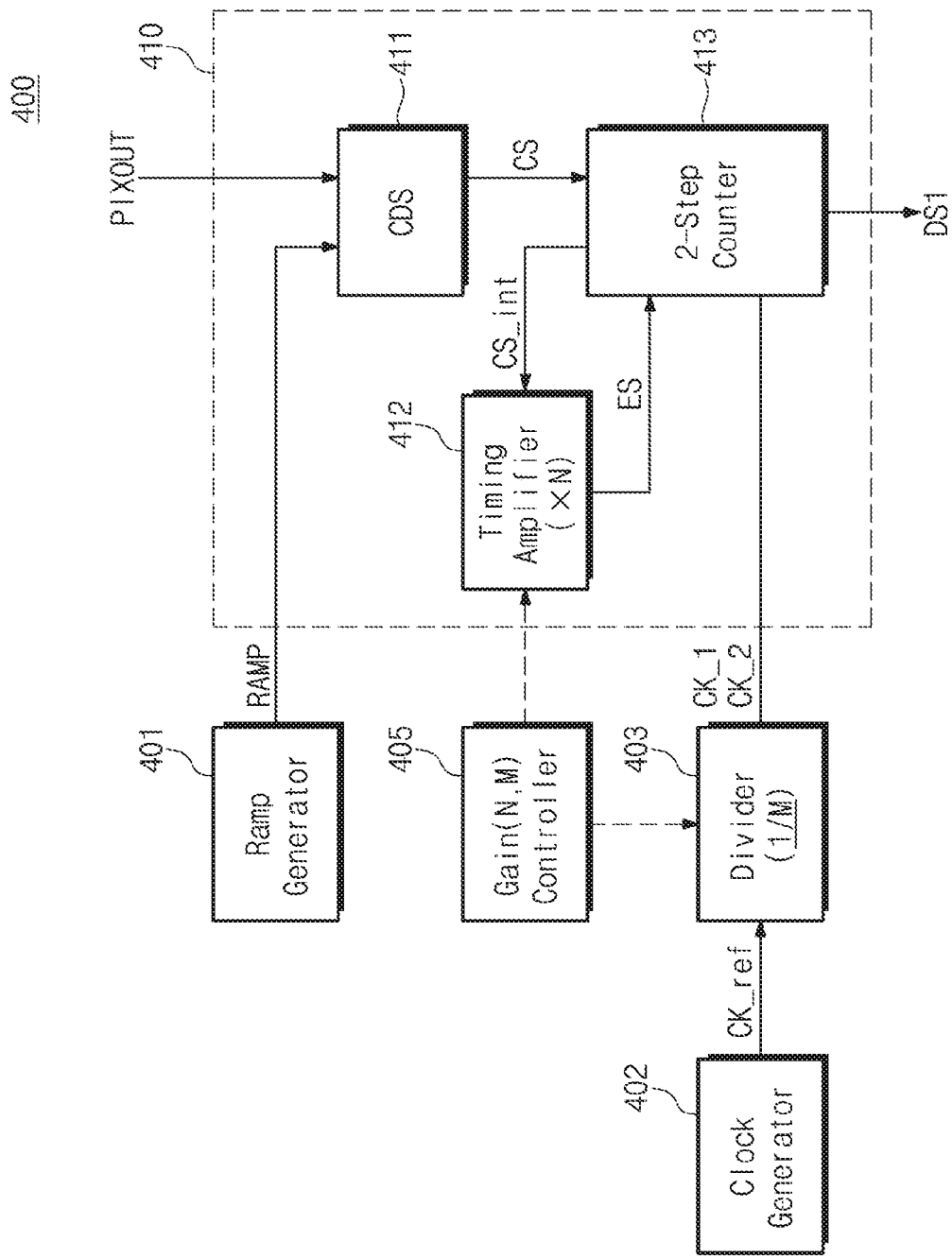
FIG. 15 is a block diagram illustrating the ADC circuit according to an exemplary embodiment of the inventive concept.

FIG. 15 is a block diagram illustrating an ADC circuit 400 according to an exemplary embodiment of the inventive concept. Referring to FIG. 15, the ADC circuit 400 may include a ramp generator 401, a clock generator 402, a divider 403, a gain controller 405, and an ADC 410. The ADC 410 may include a CDS 411, a timing amplifier 412, and a counter 413. The ramp generator 401, the clock generator 402, the CDS 411, the timing amplifier 412, and the counter 413 correspond to those described with reference to FIG. 11, and thus, a detailed description thereof will not be repeated.

The divider 403 may receive the reference clock signal CK_ref from the clock generator 402 and may divide the reference clock signal CK_ref by the division ratio "1/M" to generate first and second clock signals CK_1 and CK_2. In an exemplary embodiment of the inventive concept, the first and second clock signals CK_1 and CK_2 may be respectively used in first and second counting operations. In other words, the counter 413 may be a 2-step counter, and the first and second clock signals CK_1 and CK_2 may have different frequencies. A description of clock signals with different frequencies is given above, and thus, a detailed description thereof will not be repeated.

The gain controller 405 may control the extension ratio "N" of the timing amplifier 412 and the division ratio "1/M" of the divider 403. As described above, the gain controller 405 may control the extension ratio "N" of the timing amplifier 412 and the division ratio "1/M" of the divider 403, thereby reducing power consumption of the ADC circuit 400 or increasing a resolution for each pixel signal PIXOUT. An operation of the ADC circuit 400 of FIG. 15 is similar to the operation described with reference to FIGS. 14A and 14B except that the counter 413 is a 2-step counter. In addition, an operation of the 2-step counter is described with reference to FIGS. 11 and 12. Accordingly, a detailed description thereof will not be repeated.

As described above, the ADC circuit 400 may control the extension ratio "N" of the timing amplifier 412 and the division ratio "1/M" of the divider 403, thereby reducing power consumption of the ADC circuit 400 or increasing a resolution for each pixel signal. Accordingly, the ADC circuit having increased performance or reduced power consumption is provided.

Figure 16:
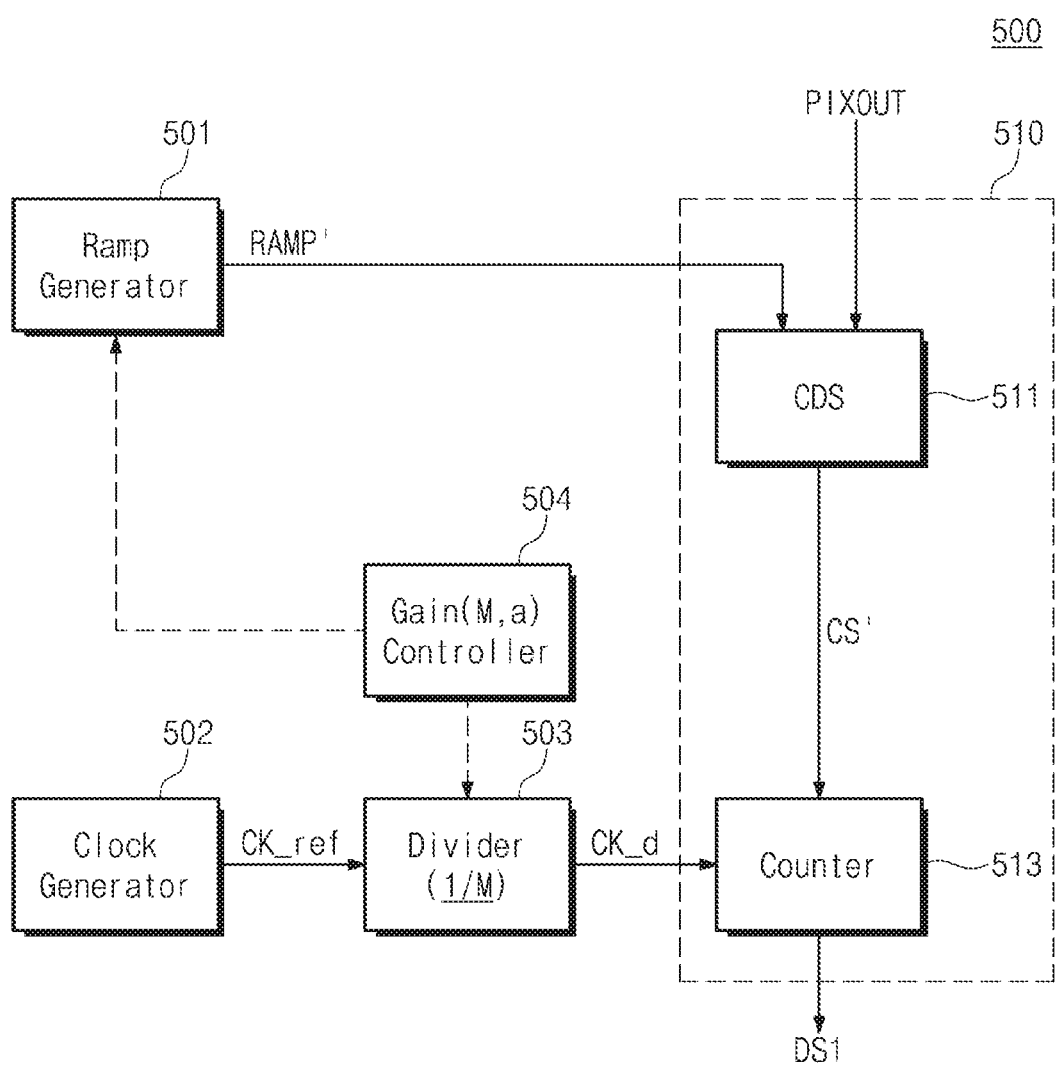
FIG. 16 is a block diagram illustrating the ADC circuit according to an exemplary embodiment of the inventive concept.
Figure 17:
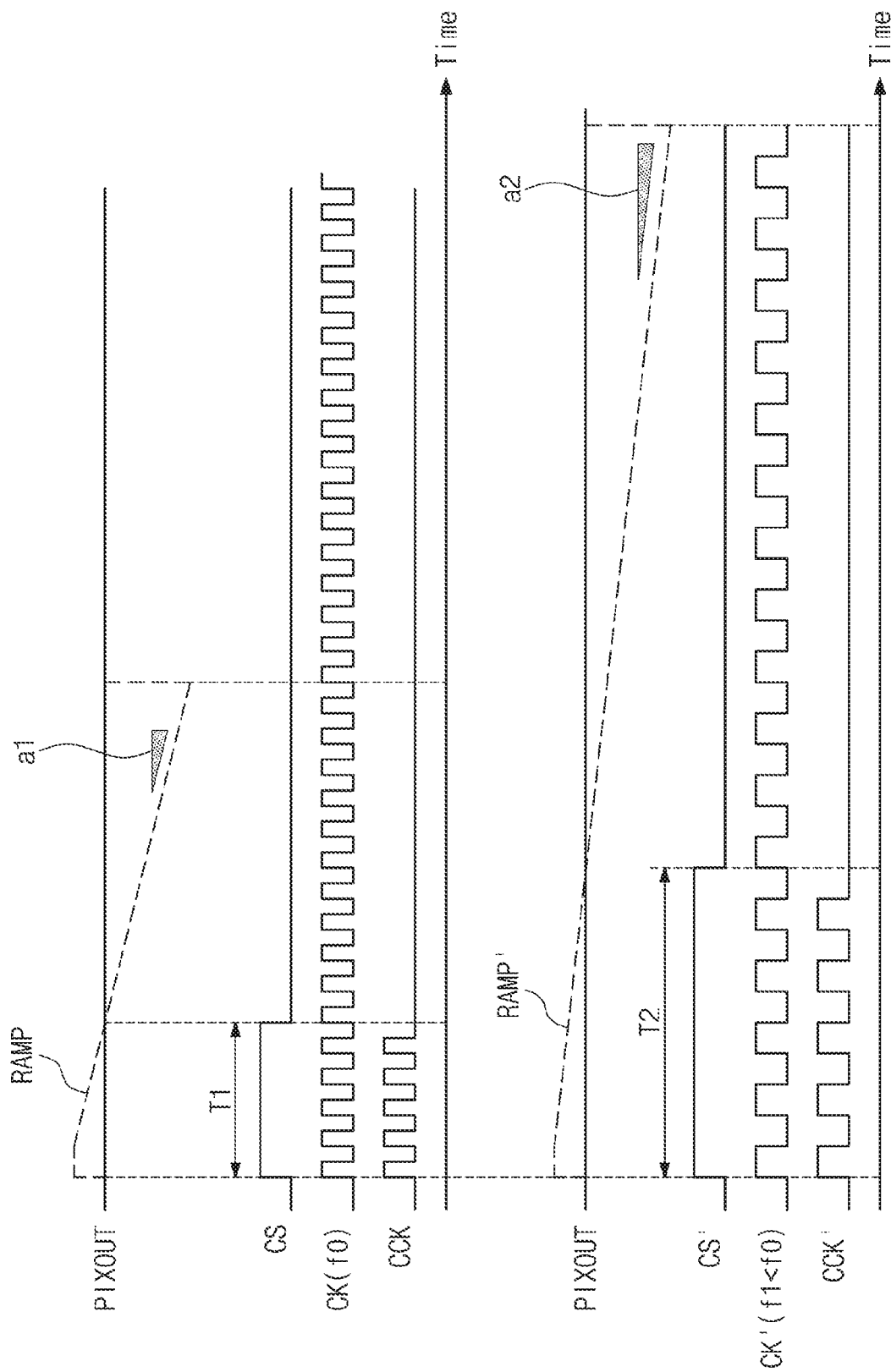
FIG. 17 is a timing diagram for describing an operation of the ADC circuit of FIG. 16, according to an exemplary embodiment of the inventive concept.

FIG. 16 is a block diagram illustrating an ADC circuit 500 according to an exemplary embodiment of the inventive concept. FIG. 17 is a timing diagram for describing an operation of the ADC circuit 500 of FIG. 16, according to an exemplary embodiment of the inventive concept. Referring to FIGS. 16 and 17, the ADC circuit 500 may include a ramp generator 501, a clock generator 502, a divider 503, a gain controller 504, and an ADC 510. The ADC 510 may include a CDS 511 and a counter 513. The ramp generator 501, the clock generator 502, the divider 503, the gain controller 504, the CDS 511, and the counter 513 correspond to those described above, and thus, a detailed description thereof will not be repeated.

In an exemplary embodiment of the inventive concept, the gain controller 504 may control the divider 503. For example, as described above, the gain controller 503 may control the division ratio "1/M" of the divider 503.

The gain controller 504 may control a ramp signal RAMP' output from the ramp generator 501. For example, the gain controller 504 may control a slope "a" of the ramp signal RAMP'. The CDS 511 may compare the ramp signal RAMP' and the pixel signal PIXOUT and may output a comparison signal CS' as the comparison result. In this case, with regard to the same pixel signal PIXOUT, an active time of the comparison signal CS' may vary with a slope of the ramp signal RAMP'.

For example, as illustrated in FIG. 17, the gain controller 504 may determine a first slope "a1" as a slope of the ramp signal RAMP. In this case, the comparison signal CS that is based on the pixel signal PIXOUT and the ramp signal RAMP may have an active time corresponding to a first time T1. In contrast, the gain controller 504 may determine a second slope "a2" as a slope of the ramp signal RAMP'. In this case, the comparison signal CS' that is based on the pixel signal PIXOUT and the ramp signal RAMP' may have an active time corresponding to a second time T2.

In other words, with regard to the same pixel signal PIXOUT, an active time of the comparison signal CS may be adjusted by controlling the slope "a" of the ramp signal RAMP. As such, an active time of the comparison signal CS may be increased by adjusting the slope "a" of the ramp signal RAMP. In this case, as in the above description, since the active time of the comparison signal CS increases, even though a relatively slow clock signal (e.g., a clock signal CK' having a first frequency f1 higher than a 0th frequency f0) is used, the same resolution may be provided with respect to each pixel signal. Alternatively, since the active time of the comparison signal CS increases, a resolution for each pixel signal may be increased by using a relatively high-speed clock signal.

Figure 18:
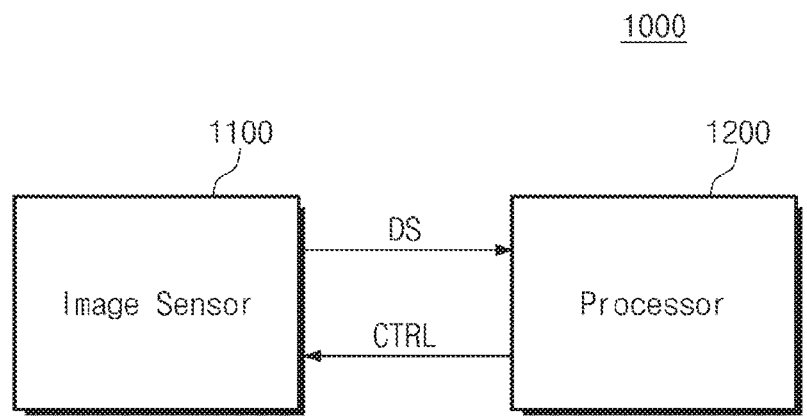
FIG. 18 is a block diagram illustrating a user device including an image sensor to which the ADC circuit according to an exemplary embodiment of the inventive concept is applied.

FIG. 18 is a block diagram illustrating a user device including an image sensor to which an ADC circuit according to an exemplary embodiment of the inventive concept is applied. Referring to FIG. 18, a user device 1000 may include an image sensor 1100 and a processor 1200. The user device 1000 may be a computing system or an information processing system, such as a computer, a notebook, a server, a workstation, a portable communication terminal, a personal digital assistant (PDA), a portable multimedia player (PMP), a smartphone, a wearable device, a digital camera, a video camera, and the like.

Under control of the processor 1200, e.g., in response to a control signal CTRL from the processor 1200, the image sensor 1100 may obtain an image from the outside and may generate the digital signal DS corresponding to the obtained image. In an exemplary embodiment of the inventive concept, the image sensor 1100 may include an ADC circuit described with reference to FIGS. 1 to 17.

The processor 1200 may process the digital signal DS from the image sensor 1100 to obtain image information. In an exemplary embodiment of the inventive concept, the processor 1200 may control an operation mode of the image sensor 1100. For example, the image sensor 1100 may include the ADC circuit described with reference to FIGS. 1 to 17, and the ADC circuit may operate in a high-performance mode or a low-power mode under control of the processor 1200. The high-performance mode may refer to a mode in which a resolution for each pixel is increased (e.g., an operation mode in which the above-described extension ratio "N" is smaller than "M" of the division ratio "1/M"), and the low-power mode may refer to a mode in which power consumption is reduced (e.g., an operation mode in which the above-described extension ratio "N" is greater than or equal to "M" of the division ratio "1/M").

In other words, the image sensor 1100 may operate in the high-performance mode or the low-power mode by controlling the extension ratio "N" or the division ratio "1/M" described with reference to FIGS. 1 to 17 under control of the processor 1200.

Figure 19:
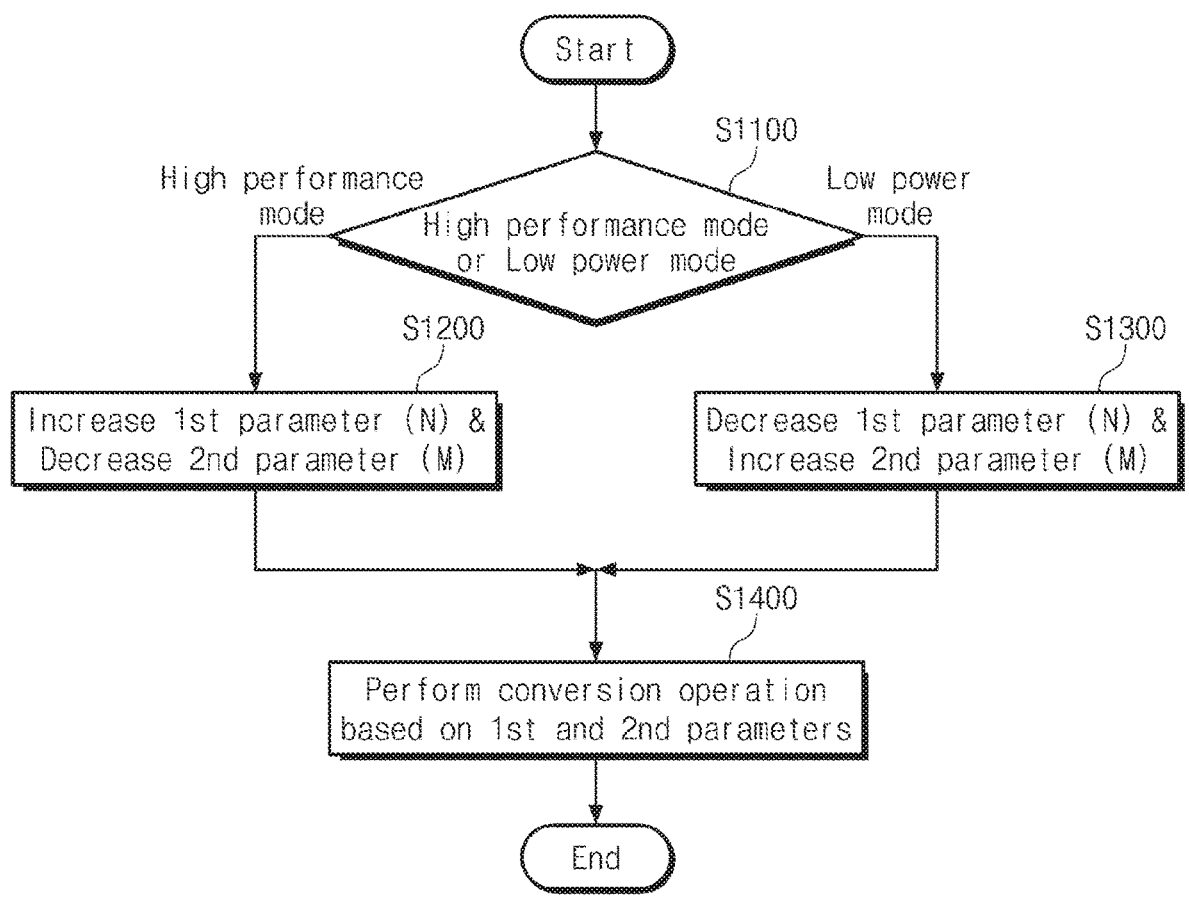
FIG. 19 is a flowchart illustrating an operation of the image sensor of FIG. 18, according to an exemplary embodiment of the inventive concept.

FIG. 19 is a flowchart illustrating an operation of the image sensor 1100 of FIG. 18, according to an exemplary embodiment of the inventive concept. Referring to FIGS. 18 and 19, in operation S1100, the image sensor 1100 may determine whether an operation mode is a high-performance mode or a low-power mode. For example, as described above, the operation mode of the image sensor 1100 may be set to the high-performance mode or the low-power mode under control of the processor 1200.

If the operation mode is the high-performance mode, in operation S1200, the image sensor 1100 may increase a first parameter (e.g., an "N" value) and may decrease a second parameter (e.g., an "M" value). If the operation mode is the low-power mode, in operation S1300, the image sensor 1100 may decrease the first parameter (e.g., an "N" value) and may increase the second parameter (e.g., an "M" value).

In operation S1400, the image sensor 1100 may perform a signal conversion operation based on the first and second parameters "N" and "M" that were just set. For example, an active time of the extended signal ES may be relatively longer as the first parameter "N" increases, and a frequency of the clock signal CK may be relatively higher as the second parameter "M" decreases. In other words, a resolution for each pixel may increase. A description associated with this is given above, and thus, a detailed description thereof will not be repeated.

In contrast, the active time of the extended signal ES may be relatively shorter as the first parameter "N" decreases, and the frequency of the clock signal CK may be relatively lower as the second parameter "M" increases. In other words, a resolution for each pixel may decrease; however, power consumption may be reduced as a frequency of the clock signal CK decreases. A description associated with this is given above, and thus, a detailed description thereof will not be repeated.

In other words, as described above, since each of the parameters "N" and "M" is controlled according to an operation mode of the image sensor 1100, it is possible to provide a high resolution for each pixel or to reduce power consumption. Accordingly, the image sensor 1100 having increased performance or reduced power consumption is provided.

Figure 20:
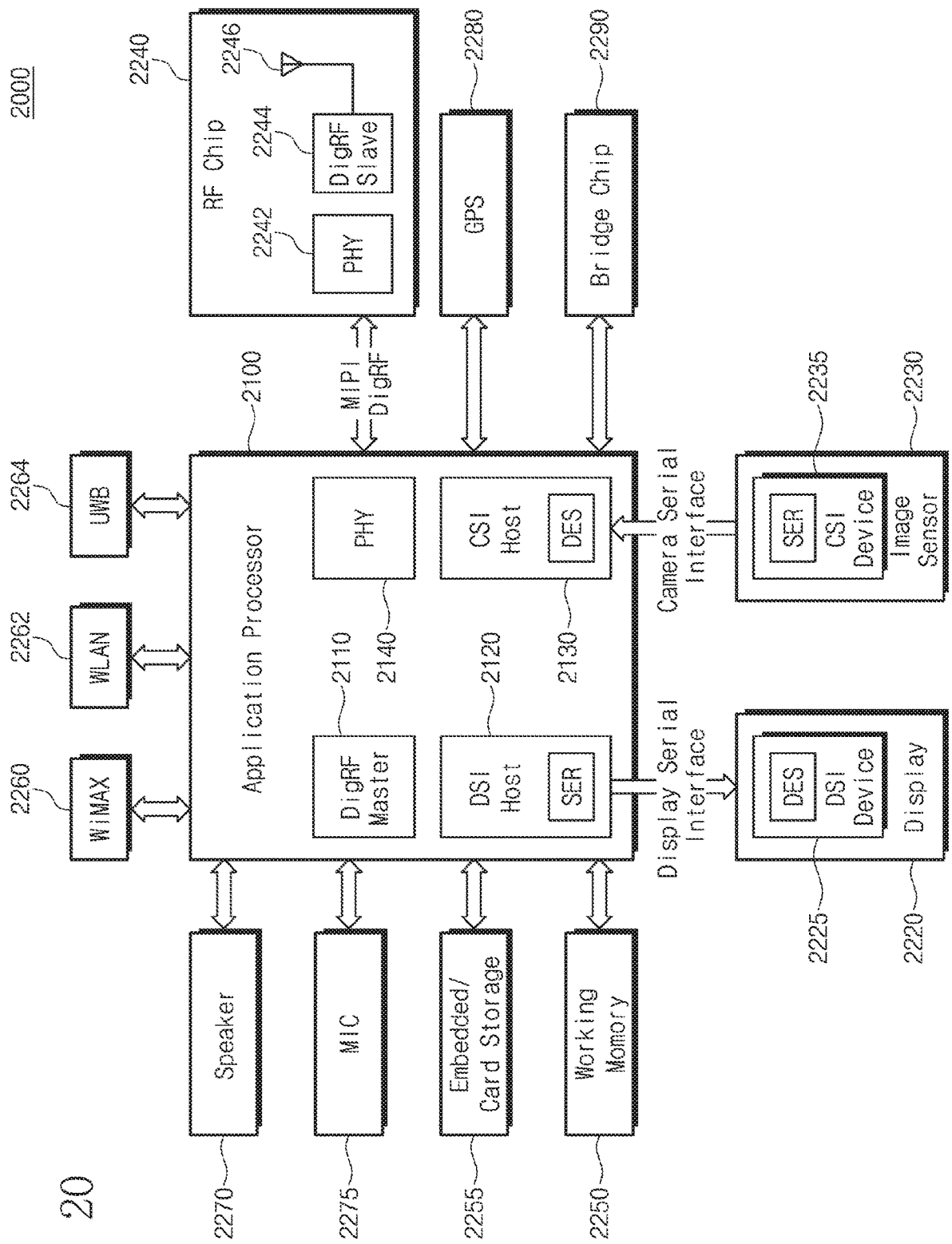
FIG. 20 is a block diagram illustrating an electronic system to which the ADC circuit according to an exemplary embodiment of the inventive concept is applied.

FIG. 20 is a block diagram illustrating an electronic system to which an ADC circuit according to an exemplary embodiment of the inventive concept is applied. Referring to FIG. 20, in an exemplary embodiment of the inventive concept, an electronic system 2000 may be in the form of a portable communication terminal, a personal digital assistant (PDA), a portable multimedia player (PMP), a smartphone, or a wearable device or in the form of a computing system such as a personal computer, a server, a workstation, or a notebook computer.

The electronic system 2000 may include an application processor 2100 (or a central processing unit), a display 2220, and an image sensor 2230. The application processor 2100 may include a DigRF master 2110, a display serial interface (DSI) host 2120, a camera serial interface (CSI) host 2130, and a physical layer 2140.

The DSI host 2120 may communicate with a DSI device 2225 of the display 2220 through the DSI. In an exemplary embodiment of the inventive concept, an optical serializer SER may be implemented in the DSI host 2120. For example, an optical deserializer DES may be implemented in the DSI device 2225. The CSI host 2130 may communicate with a CSI device 2235 of the image sensor 2230 through the CSI. In an exemplary embodiment of the inventive concept, an optical deserializer DES may be implemented in the CSI host 2130. For example, an optical serializer SER may be implemented in the CSI device 2235.

The electronic system 2000 may further include a radio frequency (RF) chip 2240 for communicating with the application processor 2100. The RF chip 2240 may include a physical layer 2242, a DigRF slave 2244, and an antenna 2246. In an exemplary embodiment of the inventive concept, the physical layer 2242 of the RF chip 2240 and the physical layer 2140 of the application processor 2100 may exchange data with each other through an MIPI DigRF interface.

The electronic system 2000 may further include a working memory 2250 and embedded/card storage 2255. The working memory 2250 and the embedded/card storage 2255 may store data received from the application processor 2100. The working memory 2250 and the embedded/card storage 2255 may provide the data stored therein to the application processor 2100.

The working memory 2250 may temporarily store data that are processed or will be processed by the application processor 2100. The working memory 2250 may include a volatile memory, such as a static random access memory (SRAM), a dynamic RAM (DRAM), or a synchronous DRAM (SDRAM), or a nonvolatile memory, such as a flash memory, a phase change RAM (PRAM), a magnetic RAM (MRAM), a resistive RAM (ReRAM), or a ferroelectric RAM (FRAM). The embedded/card storage 2255 may store data regardless of power supply. In other words, the embedded/card storage 2255 may store data in the absence of the power.

The electronic system 2000 may communicate with an external system over worldwide interoperability for microwave access (WiMAX) 2260, a wireless local area network (WLAN) 2262, ultra-wideband (UWB) 2264, or the like.

The electronic system 2000 may further include a speaker 2270 and a microphone 2275 for processing voice information. In an exemplary embodiment of the inventive concept, the electronic system 2000 may further include a global positioning system (GPS) device 2280 for processing position information. The electronic system 2000 may further include a bridge chip 2290 for managing connections between peripheral devices.

In an exemplary embodiment of the inventive concept, each of the components illustrated in FIG. 20 may include the ADC circuit described above, and the ADC circuit may operate according to one of the methods described with reference to FIGS. 1 to 19.

According to an exemplary embodiment of the inventive concept, an ADC with reduced power consumption and increased performance, an operation method thereof, and an image device including the same are provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An analog to digital converting circuit, comprising:
   a correlated double sampling circuit (CDS) configured to compare a pixel signal with a ramp signal, and to output a comparison signal;
   a timing amplifier configured to increase an active time of the comparison signal "N" times, and to output an extended signal which has a loner active time than the comparison signal, wherein the "N" is a positive integer; and
   a counter configured to output a digital signal corresponding to the pixel signal in response to the extended signal and a first clock signal.

2. The analog to digital converting circuit of claim 1, wherein the timing amplifier includes:
   a first voltage control unit configured to control a first voltage of a first node in response to the comparison signal;
   a second voltage control unit configured to control a second voltage of a second node in response to the comparison signal; and
   a comparator configured to compare the first voltage of the first node and the second voltage of the second node, and to output the extended signal.

3. The analog to digital converting circuit of claim 2, wherein the first voltage control unit includes:
   a first capacitor connected with the first node and configured to charge the first voltage of the first node in response to a reset signal; and
   a first current source connected with the first node and configured to control the first voltage of the first node in response to the comparison signal,
   wherein the second voltage control unit includes:
   a second capacitor connected with the second node and configured to charge the second voltage of the second node in response to the reset signal; and
   a second current source connected with the second node and configured to control the second voltage of the second node in response to the comparison signal, and
   wherein a value of the "N" is determined based on a capacitance of the first capacitor, an amount of current of the first current source, a capacitance of the second capacitor, and an amount of current of the second current source.

4. The analog to digital converting circuit of claim 1, further comprising: a gain controller configured to control a value of the "N".

5. The analog to digital converting circuit of claim 1, wherein the first clock signal is a signal obtained by dividing a reference clock by "1/M", wherein M is a positive integer.

6. The analog to digital converting circuit of claim 5, further comprising:
   a gain controller configured to control a value of the "M" and a value of the "N".

7. The analog to digital converting circuit of claim 6, wherein, if the value of the "M" is greater than the value of the "N", the digital signal has a first resolution, and if the value of the "M" is smaller than or equal to the value of the "N", the digital signal has a second resolution higher than the first resolution.

8. The analog to digital converting circuit of claim 1, wherein the counter performs a first counting operation in response to the extended signal and the first clock signal to generate a first bit value and an internal comparison signal, performs a second counting operation in response to the internal comparison signal and a second clock signal to generate a second bit value, and generates the digital signal in response to the first and second bit values, and
wherein a frequency of the second clock signal is lower than a frequency of the first clock signal.

9. The analog to digital converting circuit of claim 1, wherein the active time of the comparison signal is a first time from a first time point to a second time point, an active time of the extended signal is a second time from the second time point to a third time point, and
wherein the second time is "N" times the first time.

10. The analog to digital converting circuit of claim 1, wherein the active time of the comparison signal is first time from a first time point to a second time point, an active time of the extended signal is a second time from a third time point to a fourth time point, wherein the third time point is between the first time point and the second time point, and wherein the second time is "N" times the first time.

11. An analog to digital converting circuit comprising:
a correlated double sampling circuit (CDS) configured to compare a pixel signal with a ramp signal, and to output a comparison signal;
a counter configured to generate an internal comparison signal in response to the comparison signal and a first clock signal; and
a timing amplifier configured to increase an active time of the internal comparison signal "N" times, and to output an internal extended signal which has a longer active time than the comparison signal, wherein the "N" is a positive integer,
wherein the counter is further configured to:
perform a first counting operation in response to the comparison signal and the first clock signal;
perform a second counting operation in response to the internal extended signal and a second clock signal; and
output a digital signal in response to a result of the first counting operation and a result of the second counting operation.

12. The analog to digital converting circuit of claim 11, further comprising:
a gain controller configured to control a value of the "N".

13. The analog to digital converting circuit of claim 11, further comprising:
a divider configured to generate the first clock signal and the second clock signal in response to a reference clock.

14. The analog to digital converting circuit of claim 11, wherein a frequency of the first clock signal is lower than a frequency of the second clock signal.

15. The analog to digital converting circuit of claim 11, wherein the timing amplifier includes:
a first voltage control unit configured to control a first voltage of a first node in response to the internal comparison signal;

a second voltage control unit configured to control a second voltage of a second node in response to the internal comparison signal; and
a comparator configured to compare the first voltage of the first node and the second voltage of the second node, and to output the internal extended signal.

16. The analog to digital converting circuit of claim 15, wherein the first voltage control unit includes:
a first capacitor connected with the first node and configured to charge the first voltage of the first node in response to a reset signal; and
a first current source connected with the first node and configured to control the first voltage of the first node in response to the internal comparison signal,
wherein the second voltage control unit includes:
a second capacitor connected with the second node and configured to charge the second voltage of the second node in response to the reset signal; and
a second current source connected with the second node and configured to control the second voltage of the second node in response to the internal comparison signal,
wherein a value of the "N" is determined based on a capacitance of the first capacitor, an amount of current of the first current source, a capacitance of the second capacitor, and an amount of current of the second current source.

17. An operation method of an analog to digital converting circuit comprising:
comparing an analog signal with a ramp signal to generate a comparison signal;
increasing an active time of the comparison signal "N" times to generate an extended signal which has a longer active time than the comparison signal, wherein the "N" is a positive integer; and
performing a counting operation in response the extended signal and a clock signal to generate a digital signal corresponding to the analog signal.

18. The method of claim 17, wherein the generating of the digital signal includes:
generating a counting clock signal in response to the extended signal and the clock signal; and
counting a number of clocks of the counting clock signal to generate the digital signal.

19. The method of claim 17, wherein the clock signal is obtained by dividing a reference clock by "1/M", wherein M is a positive integer.

20. The method of claim 19, wherein a value of the "N" or a value of the "M" is adjusted according to an operation mode of the analog to digital converting circuit,
wherein, if the operation mode of the analog to digital converting circuit is a high-performance mode, the value of the "N" is adjusted to be greater than the value of the "M", and
if the operation mode of the analog to digital converting circuit is a low-power mode, the value of the "N" is adjusted to be smaller than or equal to the value of the "M".

* * * * *